United States Patent
Huynh et al.

(10) Patent No.: US 8,854,144 B2
(45) Date of Patent: Oct. 7, 2014

(54) HIGH VOLTAGE AMPLIFIERS AND METHODS

(75) Inventors: Paul Huynh, Ladera Ranch, CA (US); Joseph F. Tooker, Murrieta, CA (US)

(73) Assignee: General Atomics, San Diego, CA (US)

( * ) Notice: Subject to any disclaimer, the term of this patent is extended or adjusted under 35 U.S.C. 154(b) by 77 days.

(21) Appl. No.: 13/619,896

(22) Filed: Sep. 14, 2012

(65) Prior Publication Data

US 2014/0077884 A1    Mar. 20, 2014

(51) Int. Cl.
*H03F 3/04*    (2006.01)

(52) U.S. Cl.
USPC ............................ 330/310; 330/311; 330/277

(58) Field of Classification Search
USPC .......................................... 330/310, 311, 277
IPC ......................................................... H03F 3/04
See application file for complete search history.

(56) References Cited

U.S. PATENT DOCUMENTS

| | | |
|---|---|---|
| 3,256,490 A | 6/1966 | Gohm |
| 3,275,944 A | 9/1966 | Lavin |
| 3,508,162 A | 4/1970 | Eisenberg |
| 3,614,645 A | 10/1971 | Wheatley, Jr. |
| 3,619,486 A | 11/1971 | Tzakis |
| 3,715,693 A | 2/1973 | Fletcher et al. |
| 3,842,259 A | 10/1974 | Bruning |
| 3,900,800 A | 8/1975 | Maltz |
| 3,983,503 A | 9/1976 | Bannister et al. |
| 3,986,132 A | 10/1976 | Wittlinger |
| 4,193,040 A | 3/1980 | Weissman |
| 4,342,967 A | 8/1982 | Regan et al. |
| 4,484,151 A | 11/1984 | Nijman et al. |
| 4,518,924 A | 5/1985 | Vosteen |
| 4,560,914 A | 12/1985 | Lafonta et al. |
| 4,677,317 A | 6/1987 | Sakuma |
| 4,697,155 A | 9/1987 | Lehning |
| 4,843,344 A | 6/1989 | Cox |
| 4,871,977 A | 10/1989 | Schilling et al. |
| 4,897,617 A | 1/1990 | Milberger et al. |
| 5,295,104 A * | 3/1994 | McClure ........................ 365/205 |
| 5,459,433 A | 10/1995 | Fenk et al. |
| 5,629,648 A * | 5/1997 | Pratt ............................ 330/289 |

(Continued)

FOREIGN PATENT DOCUMENTS

JP    2001-060831    3/2001

OTHER PUBLICATIONS

PCT; International Search Report and Written Opinion issued in International Patent Application No. PCT/US2013/059712; Mailed Dec. 20, 2013; 10 Pages.

*Primary Examiner* — Patricia Nguyen

(74) *Attorney, Agent, or Firm* — Fitch, Even, Tabin & Flannery LLP

(57) ABSTRACT

Some embodiments provide an amplifier apparatus, comprising: a plurality of amplifier transistor circuits coupled in series, wherein each of the plurality of amplifier transistor circuits comprises: a transistor, wherein the transistors of the plurality of amplifier transistor circuits are coupled in series; a transistor voltage control and drive circuit coupled with the corresponding transistor, wherein the transistor voltage control and drive circuit is configured to control and drive the corresponding transistor in accordance with received control signals and in parallel with the other of the plurality of amplifier transistor circuits; and isolation circuitry that isolates control of the transistor from control of the other of the amplifier transistor circuits; wherein the plurality of amplifier transistor circuits are configured to be controlled and driven in parallel relative to the control signals.

20 Claims, 18 Drawing Sheets

(56) References Cited

U.S. PATENT DOCUMENTS

| | | | |
|---|---|---|---|
| 5,666,035 A * | 9/1997 | Basire et al. ............ 318/400.29 |
| 5,696,459 A | 12/1997 | Neugebauer et al. |
| 5,757,233 A | 5/1998 | Kato et al. |
| 6,137,367 A | 10/2000 | Ezzedine et al. |
| 6,498,533 B1 | 12/2002 | Sowlati |
| 6,683,499 B2 * | 1/2004 | Lautzenhiser et al. ........ 330/295 |
| 6,784,500 B2 | 8/2004 | Lemkin |
| 6,965,266 B1 | 11/2005 | Can |
| 7,486,141 B2 | 2/2009 | Do et al. |
| 7,898,339 B2 | 3/2011 | Ikeda et al. |
| 7,990,452 B2 | 8/2011 | Yan |
| 8,026,763 B2 | 9/2011 | Dawson et al. |
| 8,164,384 B2 | 4/2012 | Dawson et al. |
| 8,514,008 B2 * | 8/2013 | Yan et al. .................... 327/427 |
| 2004/0085132 A1 | 5/2004 | Pengelly et al. |
| 2005/0062517 A1 | 3/2005 | Wong et al. |
| 2007/0001735 A1 | 1/2007 | Muhlbacher et al. |
| 2010/0301948 A1 | 12/2010 | Amrutur et al. |
| 2012/0176195 A1 | 7/2012 | Dawson et al. |

\* cited by examiner

Plot of Voltage Sharing Across Transistors in N-channel Module

Test waveform of 100 Hz square-wave modulation.

Zoom in of test waveform of 100 Hz square-wave modulation.

Test waveform of 1 kHz square-wave modulation.

Zoom in of test waveform of 1 kHz square-wave modulation.

Test waveform of 5 kHz square-wave modulation.

Zoom in of test waveform of 5 kHz square-wave modulation.

HIGH VOLTAGE AMPLIFIERS AND METHODS

BACKGROUND

1. Field of the Invention

The present invention relates generally to amplifiers, and more specifically to high voltage amplifiers.

2. Discussion of the Related Art

Many systems need large voltage inputs. In some applications, the generation of such large voltage inputs can be provided through amplifiers. Many high voltage amplifiers, however, are limited by power dissipation, response times, voltage limits, and other such problems.

Further, some amplifier systems are current controlled. These systems often require dependency through the amplifier. For example, some systems employ transistors requiring that subsequent transistors are driven by previous transistors. These dependencies often reduce the effectiveness of these amplifiers and their range of applications.

SUMMARY OF THE INVENTION

Several embodiments advantageously address the needs above as well as other needs by providing systems, apparatuses and methods of providing a high voltage output. Some embodiments provide an amplifier apparatus, comprising: a plurality of amplifier transistor circuits coupled in series, wherein each of the plurality of amplifier transistor circuits comprises: a transistor, wherein the transistors of the plurality of amplifier transistor circuits are coupled in series; a transistor voltage control and drive circuit coupled with the corresponding transistor, wherein the transistor voltage control and drive circuit is configured to control and drive the corresponding transistor in accordance with received control signals and in parallel with the other of the plurality of amplifier transistor circuits; and isolation circuitry that isolates control of the transistor from control of the other of the amplifier transistor circuits; wherein the plurality of amplifier transistor circuits are configured to be controlled and driven in parallel relative to the control signals.

Other embodiments provide an amplifier apparatus, comprising: a plurality of amplifier transistor circuits coupled in series and cooperatively configured to generate an amplified output; each of the amplifier transistor circuits comprising: an input configured to receive control signals; a transistor, wherein the transistor is coupled in series with at least one other transistor of another one of the amplifier transistor circuits such that the amplifier transistor circuits are coupled in series; and a transistor voltage control and drive circuit coupled with the corresponding transistor and configured to receive the control signals and drive the corresponding transistor according to the control signals; wherein each of the plurality of amplifier transistor circuits is isolatedly controlled and isolatedly driven relative to the other of the plurality of amplifier transistor circuits such that the driving each of the amplifier transistor circuits is not dependent upon another one of the plurality of amplifier transistor circuits.

Further, some embodiments provide methods of generating an amplified output, the methods comprising: receiving control signals at a plurality of amplifier transistor circuits electrically isolated from each other; independently driving, in each of the amplifier transistor circuits, a corresponding transistor that coupled in series with at least one transistor of one or more other amplifier transistor circuits; and generating an amplified output from the series connected transistors.

BRIEF DESCRIPTION OF THE DRAWINGS

The above and other aspects, features and advantages of several embodiments of the present invention will be more apparent from the following more particular description thereof, presented in conjunction with the following drawings.

Figure 1:
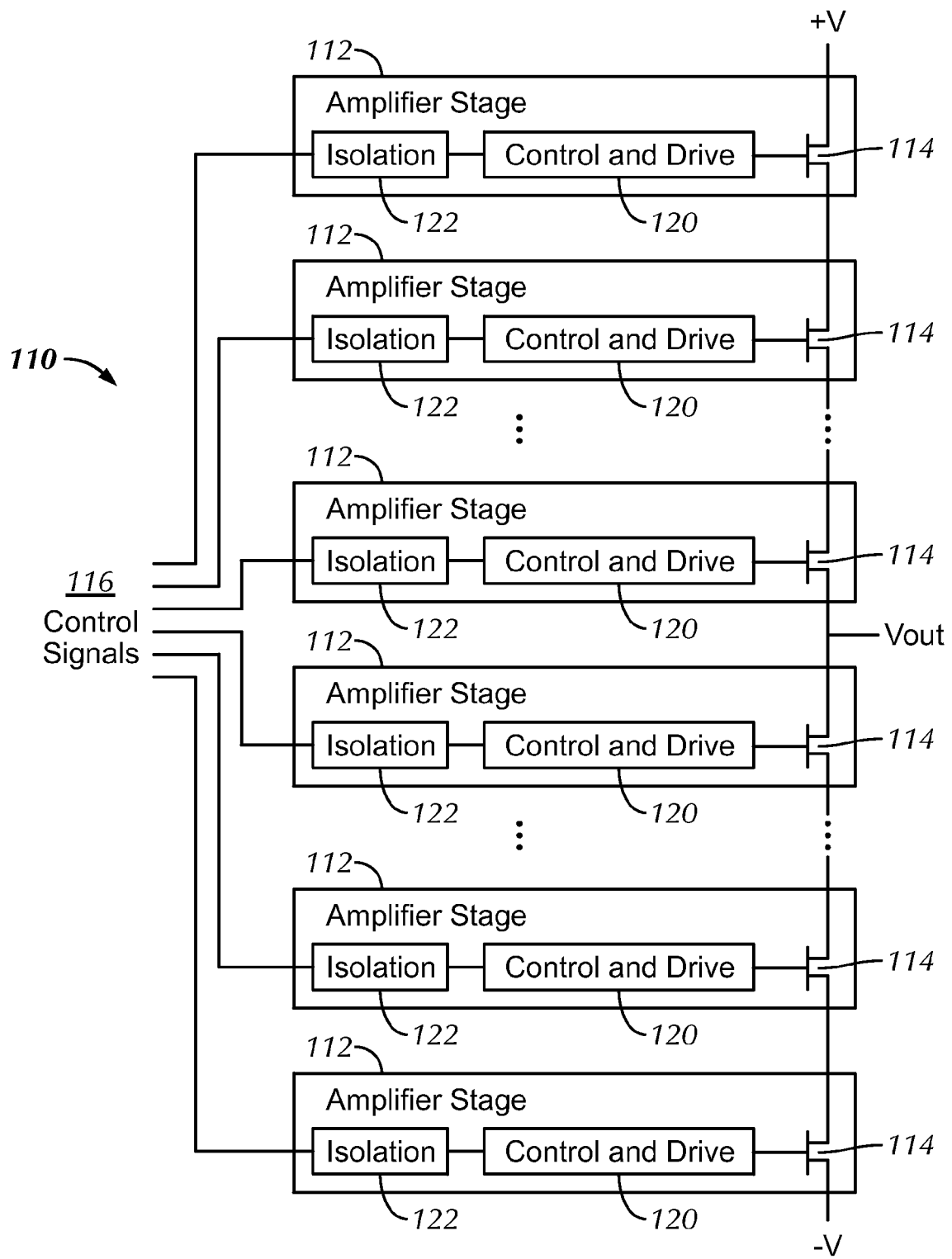
FIG. 1 depicts a simplified block diagram of a high voltage amplifier system according to some embodiments.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

The following description is not to be taken in a limiting sense, but is made merely for the purpose of describing the general principles of exemplary embodiments. The scope of the invention should be determined with reference to the claims.

Reference throughout this specification to "one embodiment," "an embodiment," "some embodiments," "some implementations" or similar language means that a particular feature, structure, or characteristic described in connection with the embodiment is included in at least one embodiment of the present invention. Thus, appearances of the phrases "in one embodiment," "in an embodiment," "in some embodiments," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, and so forth. In other instances, well-known structures, materials, or operations are not shown or described in detail to avoid obscuring aspects of the invention.

Some present embodiments provide high voltage linear amplifiers that achieve higher voltage at reduced currents, which significantly reduces the amount of dissipation that has to be controlled. In some embodiments, these high voltage linear amplifiers can provide isolation between a ground level control and the high voltage components. One example implementation of such a high voltage linear amplifier is a gyrotron body power supply driving a gyrotron vacuum tube.

Some previous high voltage amplifiers may have used a series of transistors. These previous amplifiers, however, are limited by the output voltage and/or current due to the control and isolation methods used in these previous amplifiers. Further, many previous amplifiers had to contend with large currents at the transistors requiring the dissipation of large amounts of power. This dissipation typically limits the output voltage that can be achieved.

For example, some amplifiers use a series of transistors; however, subsequent transistors are driven by previous transistors. Still further, the amplifiers are often controlled based on current levels, i.e., the current to the transistors is controlled. Further, voltage sharing resistors are typically positioned across the transistors to provide power to the transistors, but when the transistors are connected in series the resistors dissipate high power, which thus limits the output voltage. Some present embodiments do not require the sharing resistors and provide isolation between serially connected transistors. The lack of the sharing resistors further significantly reduces power dissipation, which allows for larger amplifier outputs while reducing the complexity of the system to address the power dissipation.

Some present embodiments provide high voltage amplifiers that use a series of amplifier stages, where each stage can include one or more transistors. Further, these amplifier stages can be at least partially isolated from each other such that the transistors can be driven independent of each other and in parallel. In some implementations, the amplifiers include a series of transistors that can be isolated from each other and driven separately. Further, some embodiments isolate a ground level control from high voltage amplification circuitry. This isolation of the control from the high voltage amplification circuitry can, for example, be provided at least in part by converting control signals into optical signals (e.g., into optical signals communicated over a fiber optic path) and subsequently converting the control signal back to a voltage through one or more voltage to frequency converters of the amplifier stages and/or transistor circuitry.

FIG. 1 depicts a simplified block diagram of a high voltage amplifier system 110 according to some embodiments. The amplifier system 110 comprises a plurality of amplifier transistor circuits or stages 112 coupled in series. Each of the amplifier transistor circuits 112, however, are controlled and driven in parallel through control signals 116 received in parallel. In some embodiments, the parallel driving of the amplifier transistor circuits 112 provides for at least some isolation between the amplifier transistor circuits, and in some implementations allows the amplifier transistor circuits 112 to operate independent of the other amplifier transistor circuits. The amplifier transistor circuits 112 further each include an amplifier transistor 114. The transistors 114 are coupled in series with at least one other transistor 114 from at least one of the other amplifier transistor circuits 112. Accordingly, the cooperation of the serial transistors 114 provides an amplified output Vout in accordance with the received control signals.

In some embodiments, each of the amplifier transistor circuits 112 further includes a transistor control and drive circuit 120 that couples with the corresponding transistor 114 to control and drive the transistor in accordance with the received control signals 116 and in parallel with the other of the plurality of amplifier transistor circuits. Further isolation circuitry 122 can be included in each of the amplifier transistor circuits 112 that can further isolate control of the first transistors from control of the other of the amplifier transistor circuits 112, and can provide isolation of the amplifier transistor circuits 112 from a source control that provides the control signals 116.

Substantially any number of amplifier transistor circuits 112 can be cooperated in series to achieve the desired high voltage amplification. For example, in some applications as defined by the Institute of Electrical and Electronics Engineers (IEEE), high voltages are voltages at levels of about 1000 V or more for alternating current (AC) and about 1500 V or more for direct current (DC). In other examples, as defined by the United States National Electrical Code (NEC), high voltage is voltages at or above 600 V; or as defined by British Standards (BS), high voltage is at or above 600 V AC or 900 V ripple-free DC. Additionally, sufficient amplifier transistor circuits 112 can be cooperated to achieve a desired voltage amplification in the range of between about 0 to 35 kVdc, 50 kVdc, 100 kVdc or higher. Further, the currents through the transistors 114 can be nominal, such as at steady state current levels of about 20 mA, with peak currents in the hundreds of milliamps. Still further, the high voltage amplifier system 110 can operate with a modulated signal, for example, providing high voltage amplification at modulated rates of between 0 to 5 kHz or greater. Again, substantially any number of amplifier transistor circuits 112 can be cooperated. Furthermore, some embodiments increase the current capacity and/or power dissipation by coupling additional transistors in parallel with the transistors 114, as fully described herein.

Figure 2A:
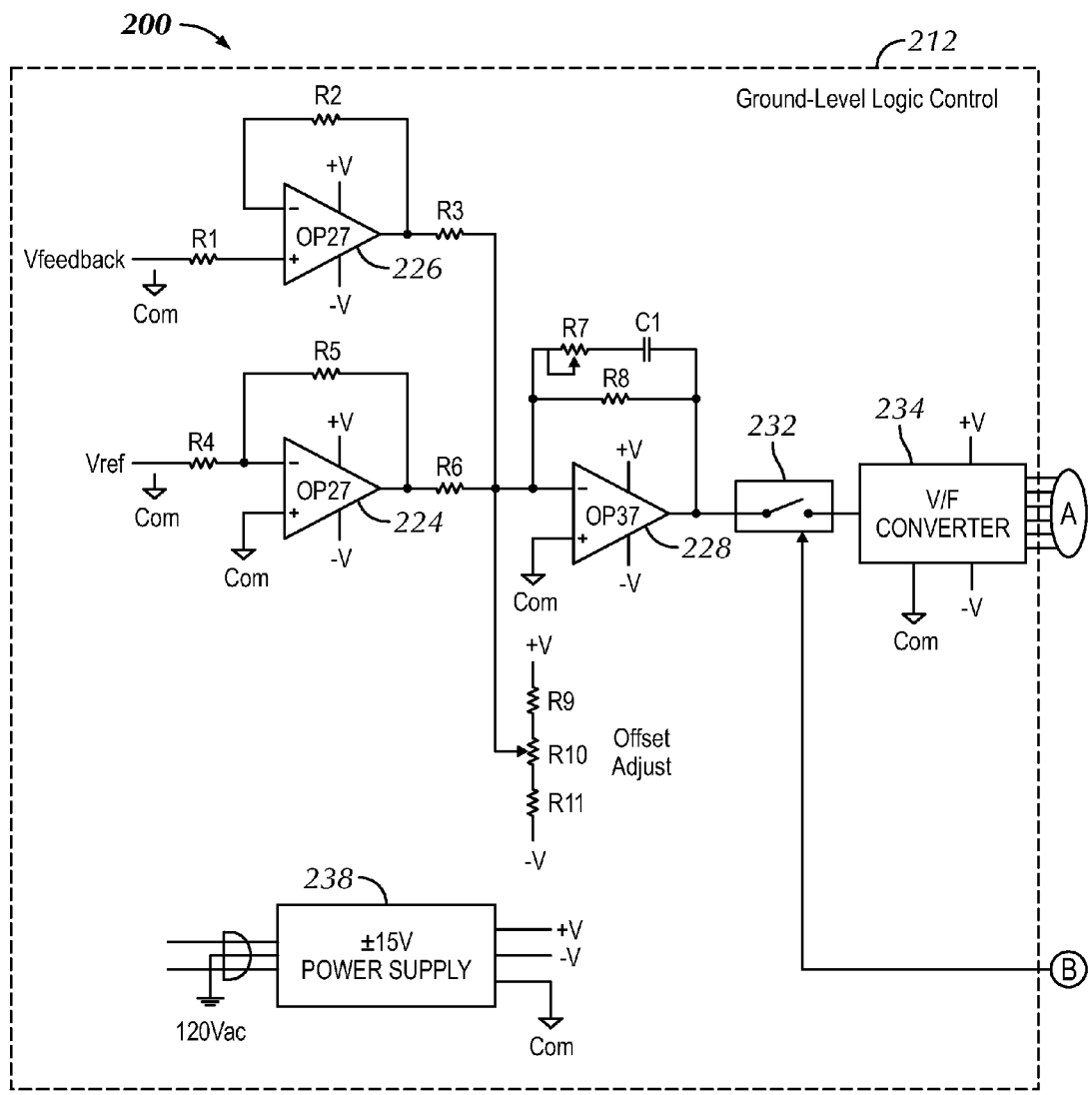
FIGS. 2A-2B depict a simplified schematic diagram of a high voltage amplifier system according to some embodiments.
Figure 2B:
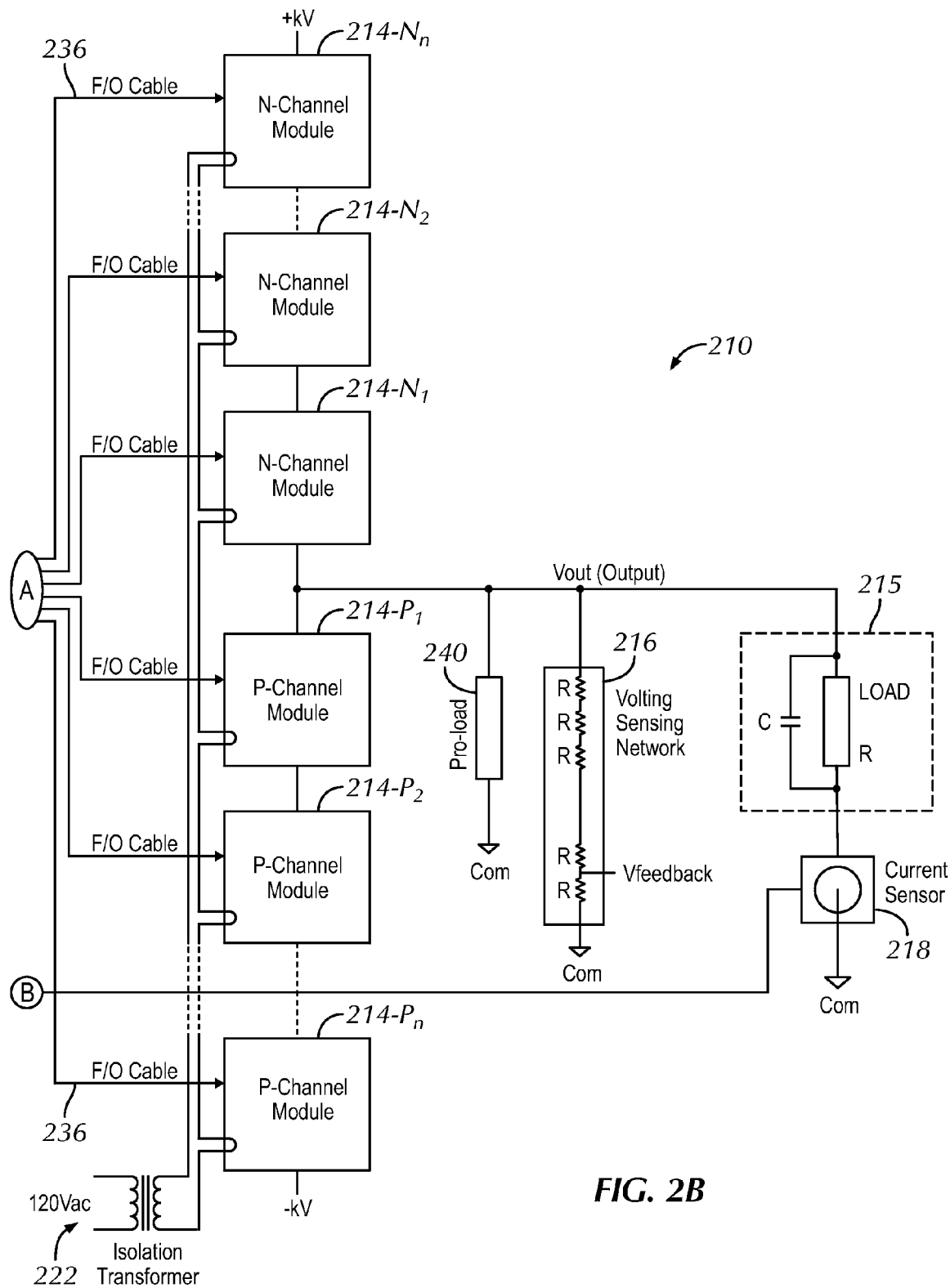

FIGS. 2A-2B depict a simplified schematic diagram of a high voltage amplifier system 200 according to some embodiments. The amplifier system 200 comprises an amplifier 210 coupled with ground level control 212. The amplifier 210 comprises a series of connected transistor modules 214 coupled with a load 215. In some embodiments, the amplifier system 200 can include a pre-load 240, a voltage-sensing network 216, a load current sensor 218, and/or one or more ground isolation power sources 222 that comprise one or more isolation transformers to provide power to the high voltage components of the amplifier system 200, including the amplifier 210.

The ground level control 212 is connected to each of the transistor modules 214, and in some embodiments is connected to each transistor module 214 through an isolation communication, such as fiber optic communication. In some embodiments, the ground level control 212 includes a regulator, an over-current interlock switch 232, a voltage-to-frequency (V/F) converter 234 (e.g., voltage to optical) with multiple fiber optic outputs 236, and a ground level power supply 238. An output feedback voltage (Vfeedback) can be supplied back to the ground level control 212. Further, some embodiments couple the current sensor 218 with the over-current interlock switch 232.

The input or reference voltage Vref is applied to the ground level control 212, for example through an amplifier circuit 224. In some embodiments, the scaled feedback voltage Vfeedback (e.g., scaled by 10000:1 or other relevant scaling depending on intended amplification) from the load output of the high voltage components is supplied to the ground level control 212, for example through a second amplifier circuit 226, to provide some precision control. Control signals are generated based on the input reference voltage Vref relative to the feedback voltage. Some embodiments generate the control signals through a third amplifier circuit 228. The control signals, in some embodiments, are further converted to optical control signals through the voltage to frequency converter 234. For example, some embodiments utilize analog optical transmission, such as one or more LED transmitters and corresponding photodiode receivers, which may deliver a response time of less than hundreds of nanoseconds. This response speed can be beneficial to the system performance of the amplifier system 200.

The control signals are sent from the ground level control 212 to each transistor module 214, and in some instances are sent through parallel, separate optical fibers or fiber-optic cables 236. The conversion to optical and the communication over the fiber optic cables 236 provide at least some electrical and high-voltage (HV) isolation between the ground level control 212 and the transistor modules 214, and can also provide some isolation between the transistor modules 214 themselves in some implementations. Accordingly, at least some electrical isolation is provided, in some embodiments, where there is no direct electrically conductive connection between the ground level control 212 and the high voltage components, including the transistor modules 214, while there is still a communication connection there between and/or other coupling, such as magnetic, optical or the like.

The transistor modules 214 are coupled in series and cooperatively generate an amplified output Vout based on the received control signals from the ground level control consistent with the reference voltage Vref applied at the ground level control. Further, the plurality of transistor modules are controlled and driven in parallel relative to the received control signals. The load 215 couples with the output Vout of the serially coupled transistor modules 214. In some embodiments, the transistor modules 214 comprise N-channel transistor modules 214-N and P-channel transistor modules 214-P, with the load 215 being connected at a junction between the serially connected set of N-channel transistor modules 214-N and set of P-channel transistor modules 214-P.

The pre-load 240 and/or the voltage-sensing network 216 can also couple with the output Vout of the serially coupled transistor modules 214 and/or across the load 215. The voltage-sensing network 216 monitors the output voltage and can provide the feedback (Vfeedback) to the ground level control 212. The pre-load 240 provides a stable closed-loop control in a no load operation allowing the transistor modules 214 and/or transistors of the transistor modules to be turned on and off. For example, the pre-load 240 can include a minimum resistive load inserted across the output of the amplifier 210. The load current sensor 218 is coupled with the load 215 to measure current through the load.

The transistor modules 214 can be further load protected from an over-current or high current spike during steady-state operation or modulation through the load current sensor 218 and the over-current interlock switch circuit 232 at the ground level control 212. When an over-current is detected, the over-current switch circuit 232 (e.g., implemented through one or more analog switches) can be activated to shunt the output of the regulator (e.g., to a logic low), which can result in turning off the transistor modules 214 and/or transistors of the transistor modules 214.

The ground isolation source 222 is used to power the transistor modules 214 through one or more high voltage power cables providing high voltage isolation between the power source (e.g., the power source 238 at the ground level control 212) and each transistor module 214, and also between the transistor modules 214. Accordingly, the ground isolation source 222 can provide at least some electrical isolation such that there is not a direct electrically conductive path. In some instances, the isolation power source 222 further includes one or more rectifiers, filters and/or other relevant components.

Again, the control signals are sent from the ground level control 212 to each transistor module 214. Further, the control signals are typically separated such that opposite polarity signals are appropriately sent to the N-channel modules and the P-channel modules, respectively. Some embodiments further allow threshold voltage adjustments providing compensation for transistor threshold activation voltage variations between the various transistors of the transistor modules 214. In some instances, threshold voltages (e.g., 0 to +5V) can be adjusted and/or set by adjusting one or more transistor threshold voltage adjustment circuits. For example, the transistor threshold voltage adjustment circuit can comprise a potentiometer in each transistor module 214. Other embodiments, however, integrate voltage threshold adjustments and/or adjustment circuits into the ground level control 212, for example, cooperated with and/or within the voltage to frequency converter 234. For example, the ground level control 212 can include two potentiometers, one associated with the N-channel transistors of N-channel transistor modules 214-N and the other potentiometer associated with the P-channel transistors of P-channel transistor modules 214-P. Moreover, these threshold voltages can be adjusted any time, with or without the present of high voltage. Further, the use of the potentiometers, at least in part, provides consistent timing so that the plurality of amplifier transistor circuits can have consistent response time and are activated at substantially the same time.

The fiber optic communication from the ground level control 212 provides some isolation of the logic control from the high voltage circuitry. Further, the optical communication provides some isolation between the transistor modules 214.

Additional isolation between the transistor modules is provided through the ground isolation source 222.

Figure 3A:
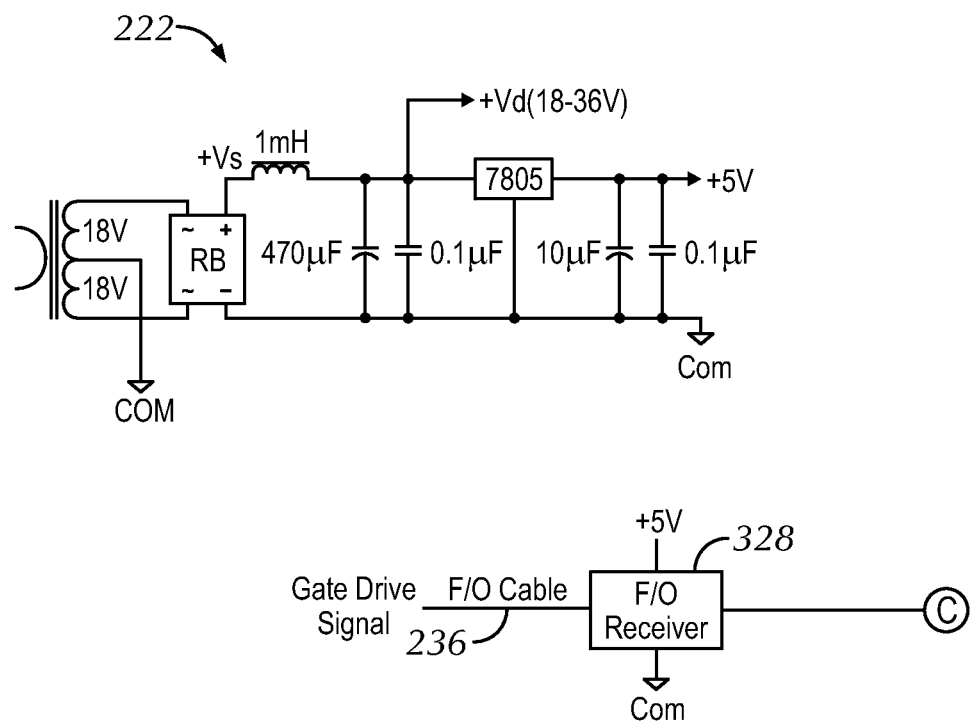
FIGS. 3A-3B show a simplified schematic, block diagram of an N-channel transistor module, according to some embodiments.
Figure 3B:
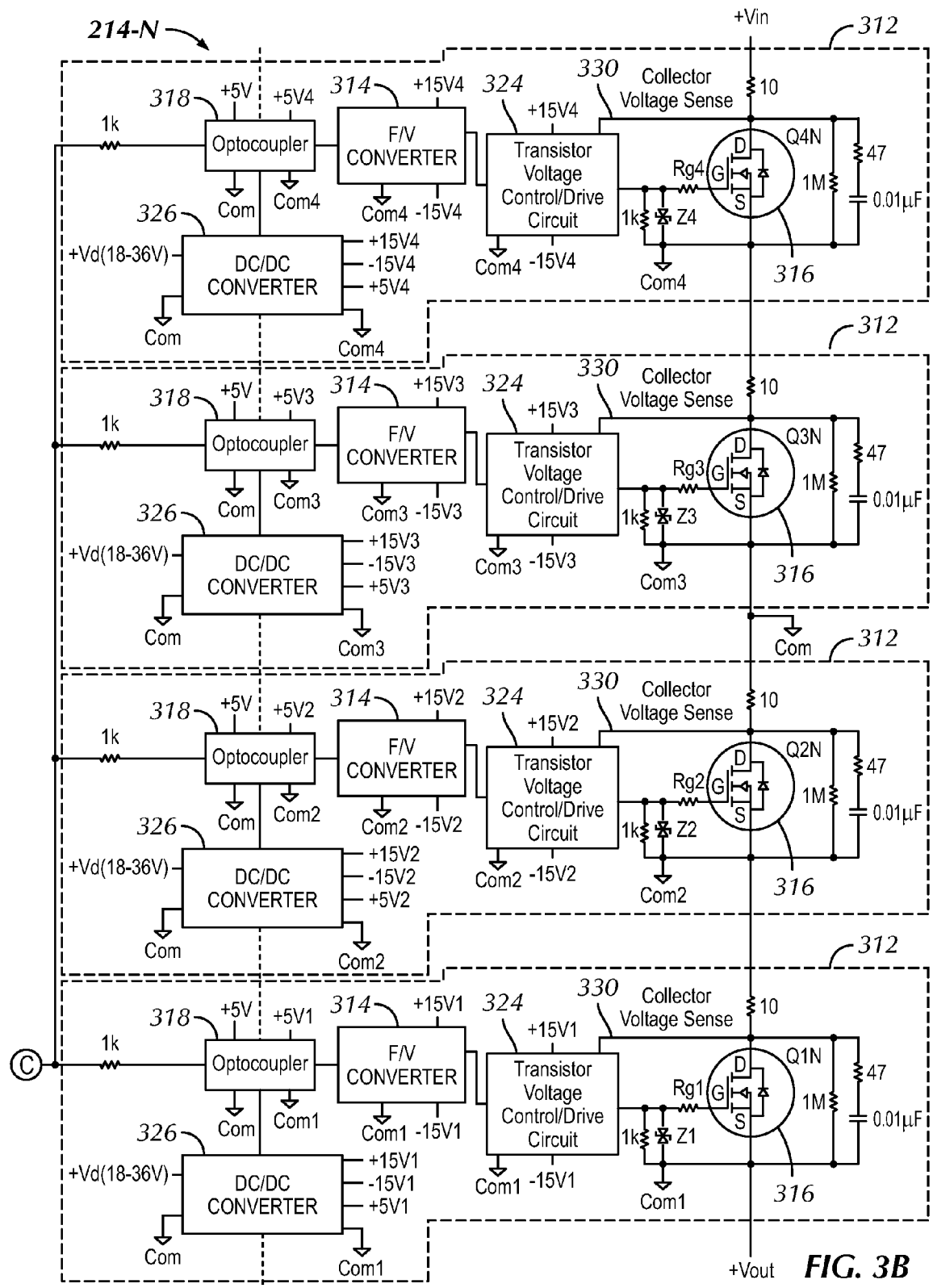
Figure 4A:
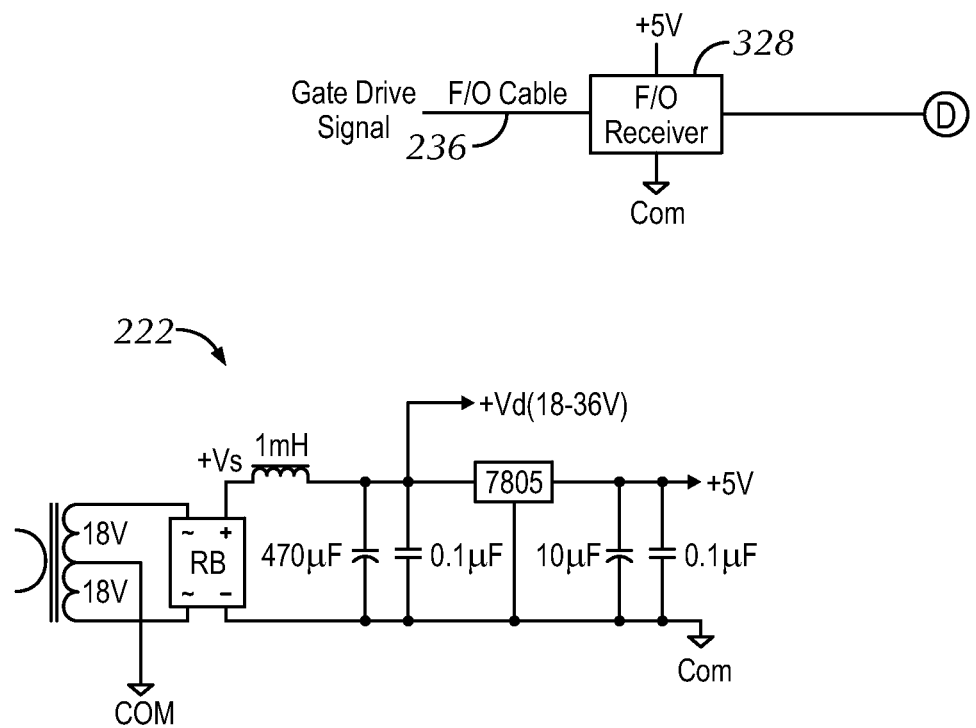
FIGS. 4A-4B show a simplified schematic, block diagram of a P-channel transistor module, in accordance with some embodiments.
Figure 4B:
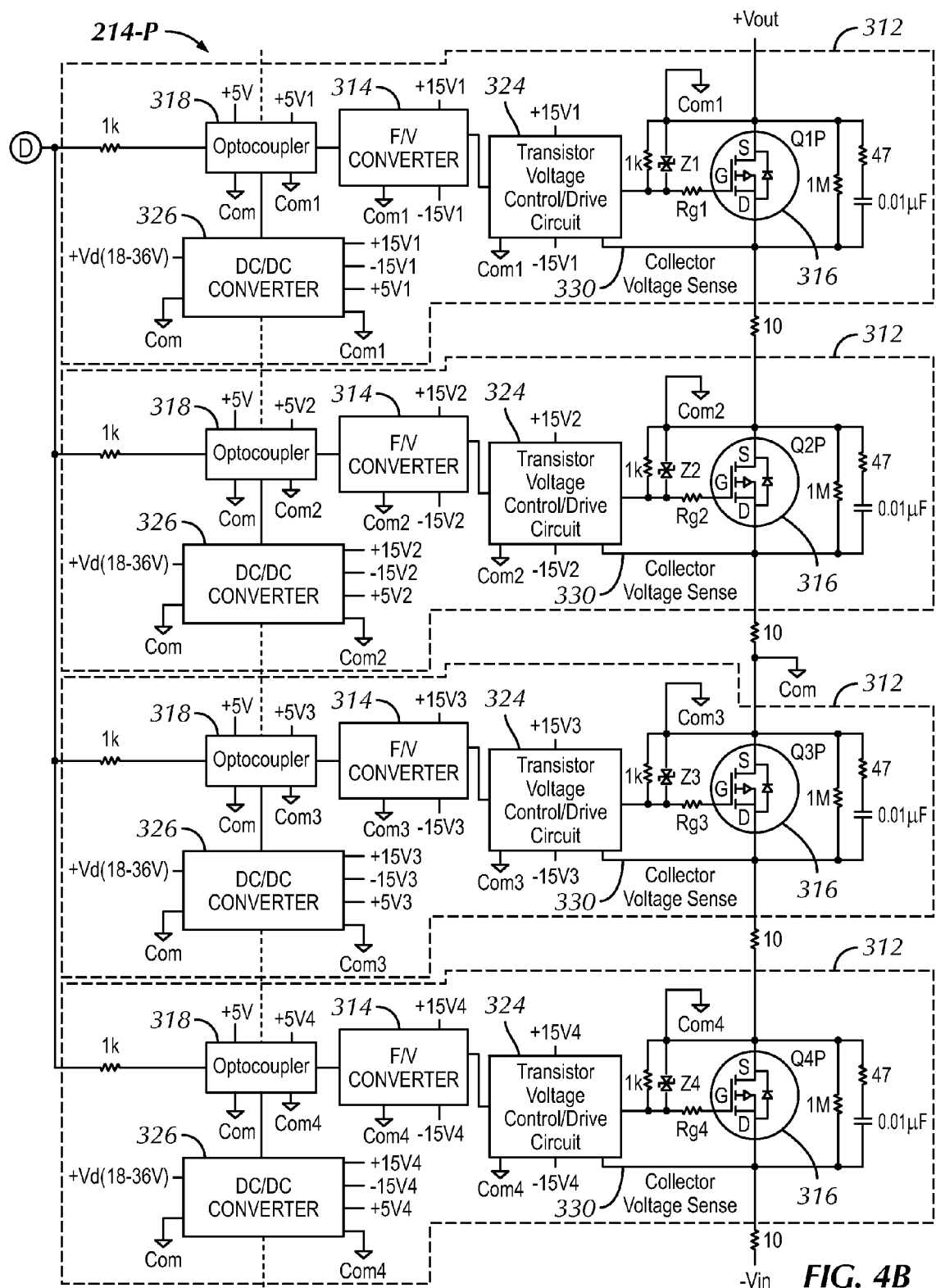

FIGS. 3A-3B show a simplified schematic, block diagram of an N-channel transistor module 214-N, according to some embodiments. FIGS. 4A-4B a simplified schematic, block diagram of a P-channel transistor module 214-P in accordance with some embodiments. Referring to FIGS. 3A-3B and 4A-4B, the transistor modules 214-N, 214-P include, in some implementations, multiple amplifier transistor circuits 312 (e.g., four amplifier transistor circuits 312) connected in series. The amplifier transistor circuits 312 include a transistor voltage control and drive circuit 324, and a transistor 316 (e.g., an N- or P-channel metal oxide semiconductor field-effect transistor (MOSFETs)) and accompanying circuitry (e.g., resistors, capacitors, diodes, etc.). In some embodiments, the amplifier transistor circuits 312 further include some isolation circuitry. For example, an amplifier transistor circuit 312 can include an optocoupler 318. The optocoupler 318 or other relevant circuitry can provide an electrical isolation by receiving the input control signals (e.g., in a frequency format) and forwarding the control signals to a frequency-to-voltage (F/V) converter 314 that can convert the input control signals to voltage control signals. The amplifier transistor circuit 312 can further include an isolated DC to DC power converter supply 326 deriving electrical power from the one or more transformers in the ground isolation source 222. In some embodiments, the transistor modules 214-N, 214-P can include one or more fiber optic receivers 328 when the input control signals are received via one or more optical fibers 236. Again, the ground isolation source 222 provides power to the transistor modules 214, and in some instances, the ground isolation source 222 powers the transistor modules 214 through a single high voltage power cable, providing further high voltage isolation between the power at the ground-level control and the transistor modules 214 and other high voltage components.

The fiber optic receiver 328 couples with the one or more fiber optic cables 236 to receive the optical control signals from the ground level control 212. Accordingly, the optical communication provides at least some high-voltage isolation between the ground level control and the high voltage components, including the transistor modules 214 and amplifier transistor circuits 312. The fiber optic receiver 328 forwards the input control signals to the optocouplers 318 of the plurality of amplifier transistor circuits 312. In some embodiments, the optocouplers 318 receive the control signals in parallel from fiber optic receiver 328, which provides further electrical isolation between the amplifier transistor circuits 312.

The transistor voltage control and drive circuit 324 couples with the frequency to voltage converter 314 and drives a respective transistor 316 in accordance with the control signals received from the frequency to voltage converter 314. Accordingly, the transistor 316 provides the transistor output voltage in accordance with the control signal. The transistor output voltage is cooperated with the transistor output voltages of the other serially coupled transistors 316 of the other amplifier transistor circuits 312 and other transistor modules 214 to produce the amplified output Vout. As described above, the transistors 316 of the multiple amplifier transistor circuits 312 are operationally isolated and driven in parallel. The isolation is achieved, at least in part, through the utilization of the respective DC to DC power converter 326 providing power to the corresponding amplifier transistor circuits 312, and each amplifier transistor circuit receiving the control signals through respective optocouplers 318.

Each transistor voltage control and drive circuit 324 independently drives a corresponding transistor 316 (e.g., MOSFET). In some embodiments, the transistor voltage control and drive circuit 324 further includes feedback control based on a feedback path 330 in order to control the voltage across the corresponding transistor. The feedback circuitry and feedback 330, in some embodiments, provides control and attempts to achieve substantially equal voltage across each transistor 316, at least of a transistor module 214. Accordingly, the feedback circuitry and the transistor voltage control and drive circuit 324 of the amplifier transistor circuits 312 provide voltage sharing circuitry such that the output voltage Vout is shared across the plurality of serially coupled transistors 316. The feedback circuitry can further aid in providing accurate activation voltage and timing of each transistor 316 so that each separate transistor 316 provides substantially the same desired voltage at substantially the same response time when changing voltage in response to changes at the reference voltage (e.g., changing at a rate of 5 KHz). Additionally, the cooperation of the feedback circuitry of the amplifier transistor circuits and the threshold adjustments (e.g., through potentiometers at each amplifier transistor circuit, or at the ground level) provides accurate and consistent timing so that the plurality of transistors 316 have consistent response time and are activated at substantially the same time.

In some instances, the feedback circuitry of the transistor voltage control and drive circuit 324 can include a voltage sensing circuit (e.g., collector voltage sensing) and amplifier to adjust the control signal voltage to the transistor 316. Additionally, in some embodiments, the feedback circuitry in cooperation with the transistor voltage control and drive circuit 324 provide consistent voltage and response time of the plurality of transistors 316 of the transistor modules and/or amplifier so that off the shelf transistors can be used, typically with no pre-matching or only minimal pre-matching.

Accordingly, the transistor modules 214 control and drive the transistors 316 different than prior systems. Again, some prior systems control transistor action based on current. Additionally, some prior systems connect transistors in series; however, preceding transistors drive subsequent transistors. Some present embodiments instead provide isolation while cooperating the transistors in series, driving the transistors in parallel, and using voltage in controlling the transistor outputs. Still further, present embodiments can eliminate the share resistors of prior systems and the resulting dissipation from those share resistors, which allows for greater outputs.

It is noted that FIGS. 3A-3B and 4A-4B show four amplifier transistor circuits 312 in each transistor module 214. However, more or fewer amplifier transistor circuits 312 can be included in each transistor module 214. Similarly, substantially any number of transistor modules 214 can be included in the amplifier 210 to achieve an intended output Vout.

Some embodiments further include multiple transistors 316 in an amplifier transistor circuit 312, with the multiple transistors within an amplifier transistor circuit 312 being coupled in parallel. The set of parallel transistors in each amplifier transistor circuit 312 can be configured to allow for operation at greater currents while distributing power dissipation over the multiple parallel transistors.

Figure 5:
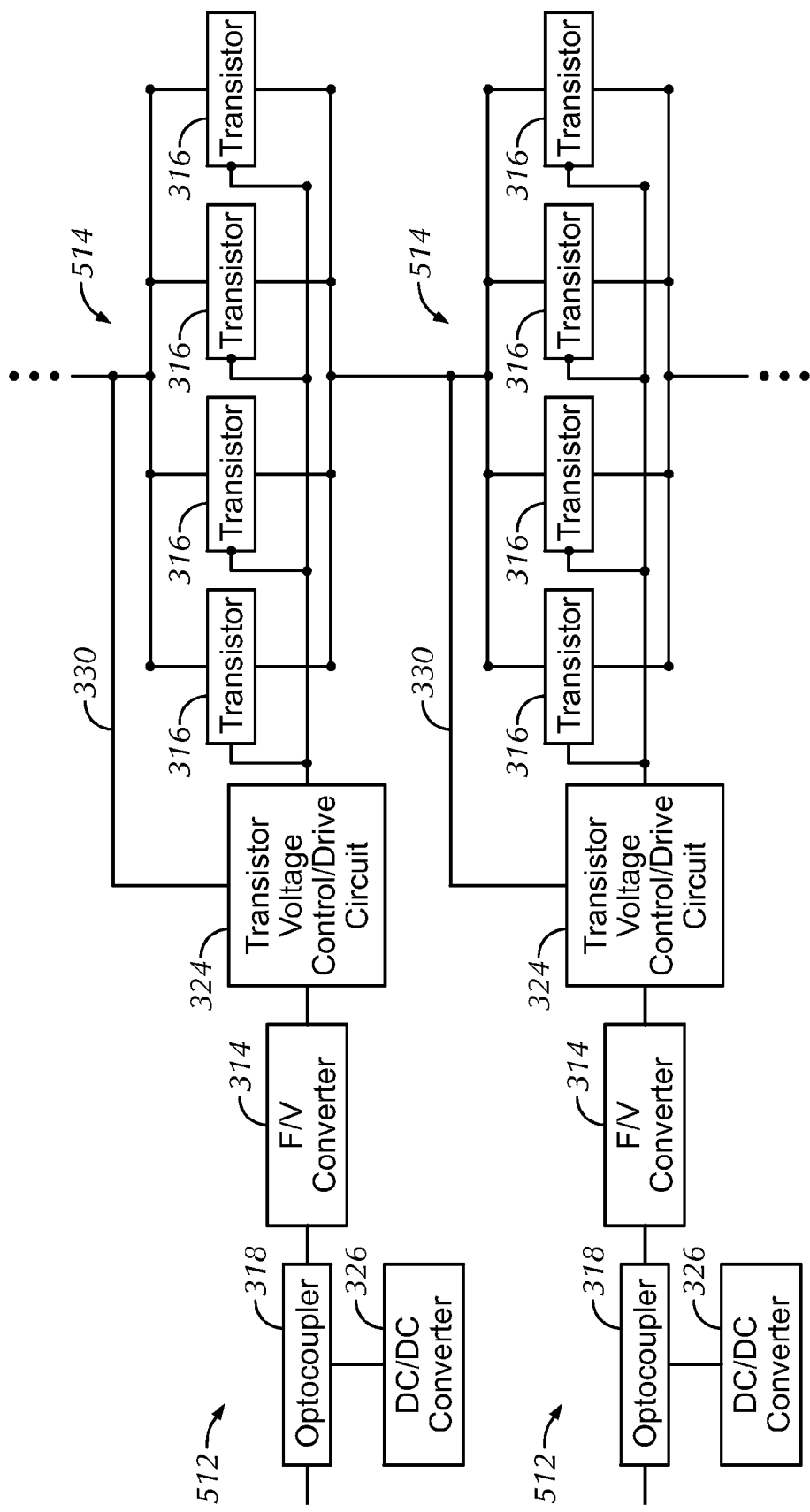
FIG. 5 shows a simplified block diagram of a plurality of amplifier transistor circuits, in accordance with some embodiments.

FIG. 5 shows a simplified block diagram of a plurality of amplifier transistor circuits 512 in accordance with some embodiments. In this embodiment, the amplifier transistor circuits 512 are part of an N-channel transistor module 214-N. Similar amplifier transistor circuits 512 can be configured for P-channel amplifier transistor circuits and/or P-channel transistor modules 214-P. In this embodiment, each amplifier transistor circuit 512 comprises a set 514 of transistors 316 coupled in parallel. Further, each set 514 of parallelly coupled transistors is further coupled in series with one or more other sets 514 of transistors of one or more other amplifier transistor circuits 512. In some embodiments, each of the amplifier transistor circuits 512 further includes an optocoupler 318, a frequency to voltage converter 314, a transistor voltage control and drive circuit 324, and feedback path 330. Other isolation circuitry may additionally or alternatively be utilized.

The amplifier transistor circuits 512 are driven in parallel with the serially connected sets 514 of transistors cooperating to provide the amplified output in accordance with the control signals. In some embodiments, similar to the amplifier transistor circuits 312 of FIGS. 3A-3B and 4A-4B, the optocoupler 318 couples with an input to receive the input control signals. The optocoupler 318 further couples with the frequency to voltage (F/V) converter 314, which in turn is coupled with the transistor voltage control and drive circuit 324. The transistor voltage control and drive circuit 324 receives the control signal from the frequency to voltage converter 314, and based on the received control signals and feedback 330 accordingly drives the corresponding set 514 of parallel transistors. Because of the parallel coupling of the transistors 316, a larger current can be carried by distributing the current over the multiple transistors. Additionally, the multiple transistors 316 in parallel can further distribute the dissipation of power over the multiple transistors.

The amplifier transistor circuits 512 are depicted with four transistors 316 coupled in parallel in each amplifier transistor circuit. It will be understood by those skilled in the art that substantially any number of transistors 316 can be coupled in parallel to provide for substantially any current and/or to distribute the power dissipation. Further, FIG. 5 shows two amplifier transistor circuits 512 coupled in series. It will be apparent to those skilled in the art that substantially any number of amplifier transistor circuits 512 can be serially coupled to achieve the intended amplified output Vout.

For example, an amplifier system 200 can be configured, in accordance with some present embodiments, that provides an output voltage of about 80 kV and a current of about 50 A. Further, some embodiments can be configured with a power dissipation of about 0.5 MW in nominal operation, and about 1.5 MW in modulation at a no-load input voltage of about 100 kV. With each set 514 of parallel-coupled transistors comprising four transistors in parallel, each transistor 316 would have a load current of about 12.5 A (50 A÷4). Substantially any number of these amplifier transistor circuits 512 can be cooperated to achieve the desired amplification, including numerous amplifier transistor circuits 512 connected in series to provide the amplified output and withstand an voltage of 100 kV at no load, with each transistor having a voltage of about 100 V across it and a dissipation of about 125 W nominal and up to 375 W during modulation. Other configurations can also be implemented with sets 514 of parallel transistors having larger or smaller numbers of transistors in parallel, and/or substantially any number of amplifier transistor circuits 512. The numbers of transistors can vary depending on many factors, such as the type of transistors, and the power dissipation that a package can tolerate.

Figure 6A:
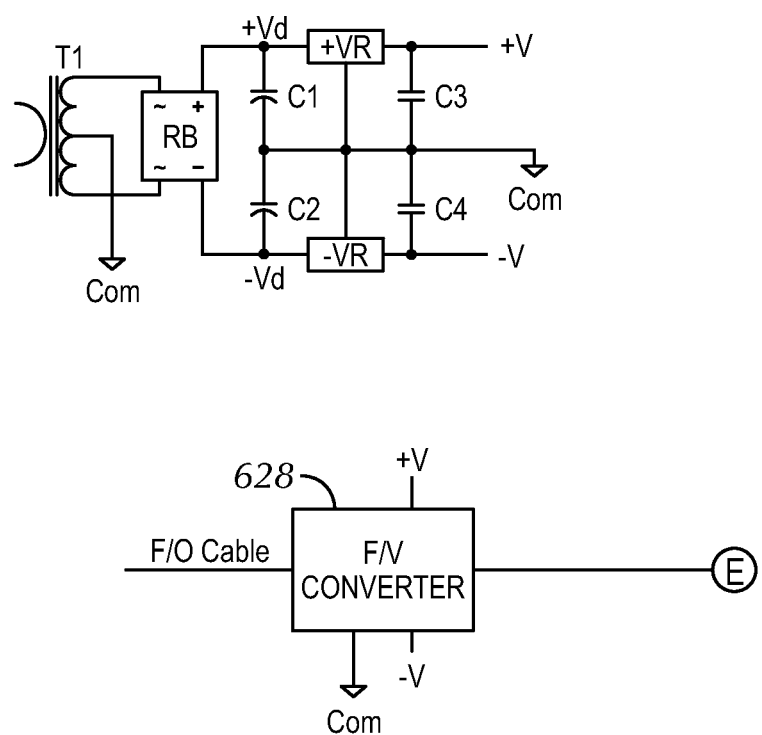
FIGS. 6A-6B depict a simplified block diagram of an alternate N-channel transistor module according to some embodiments.
Figure 6B:
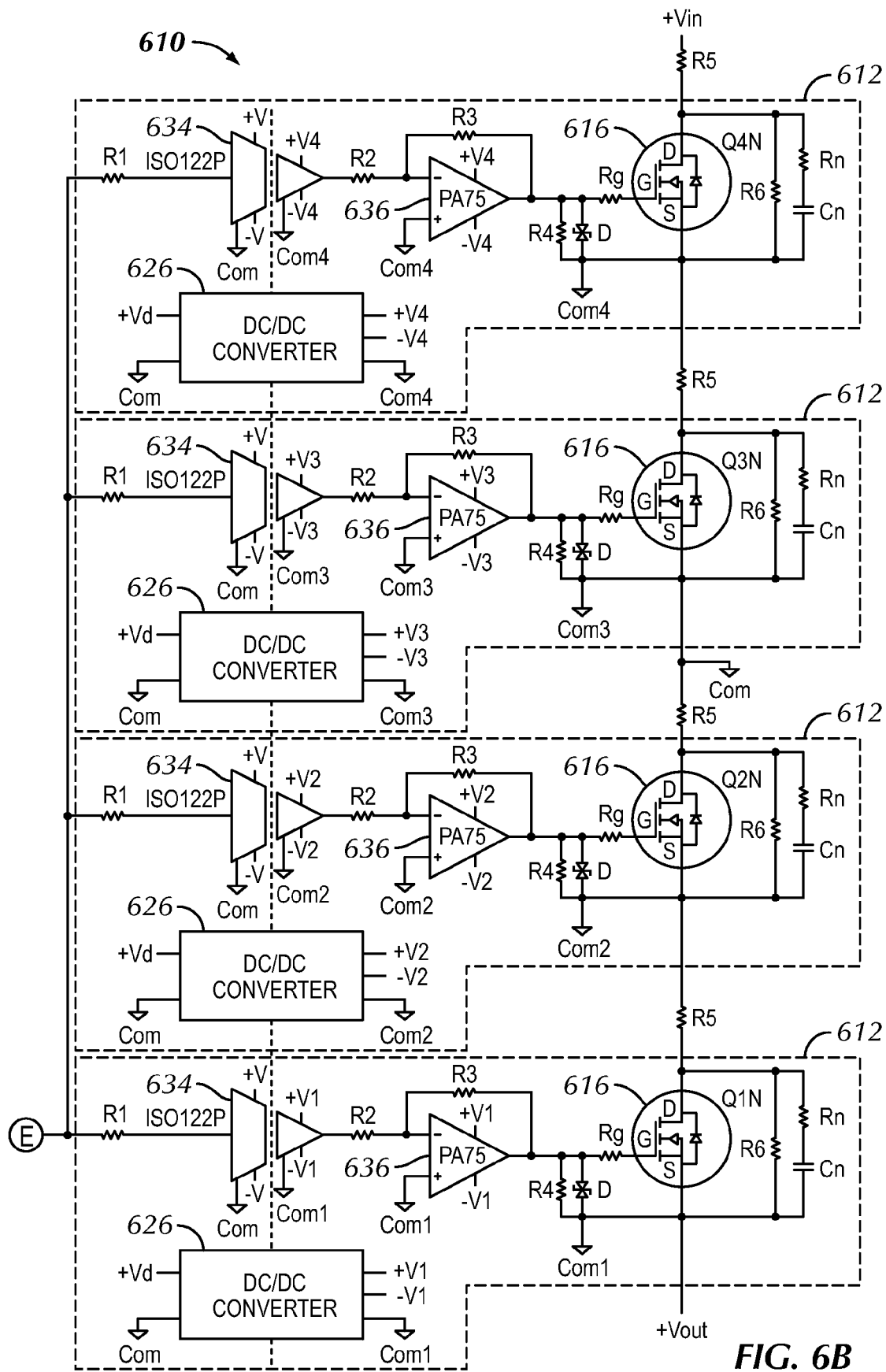
Figure 7A:
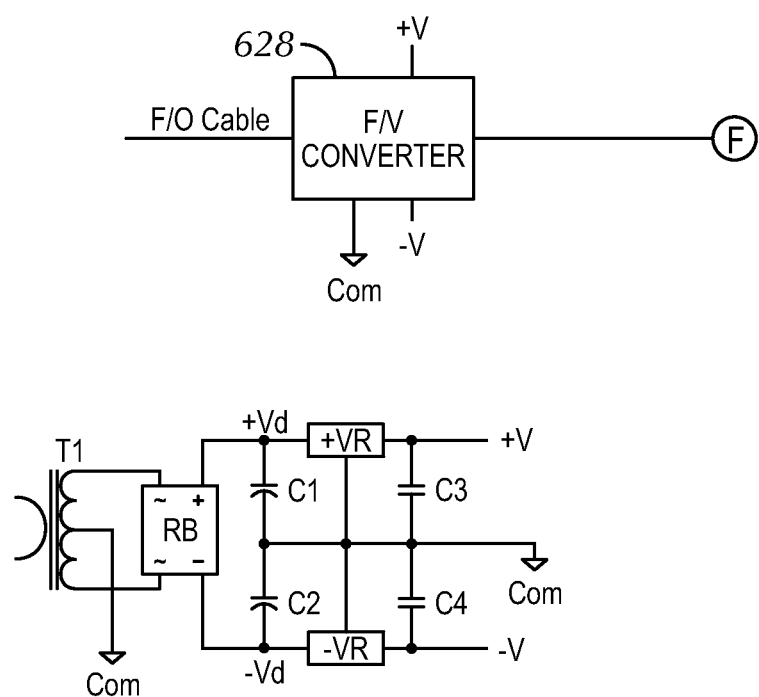
FIGS. 7A-7B depict a simplified block diagram of an alternate P-channel transistor module according to some embodiments.
Figure 7B:
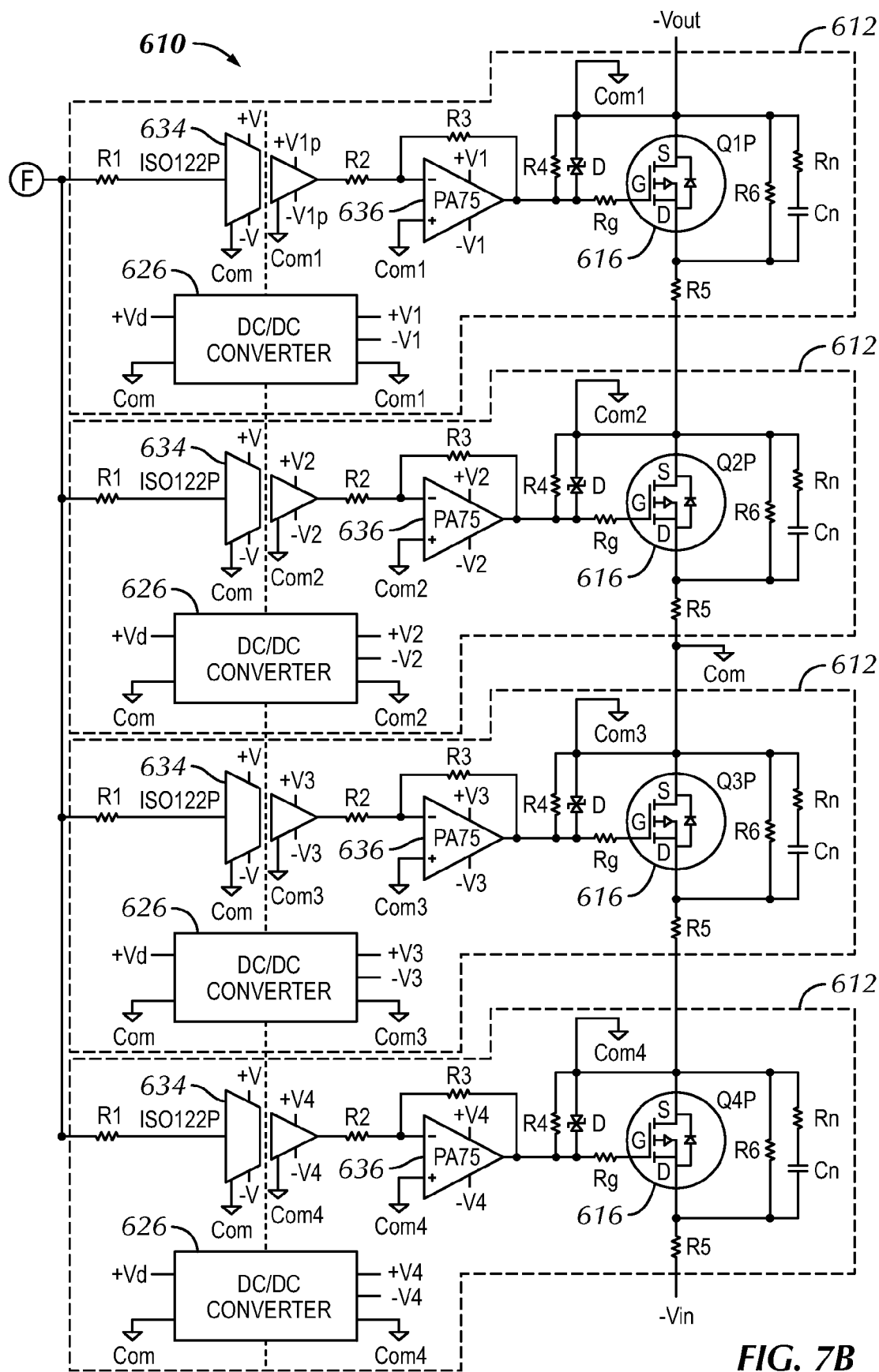

FIGS. 6A-6B depict a simplified block diagram of an alternate N-channel transistor module 610 according to some embodiments. FIGS. 7A-7B depict a simplified block diagram of an alternate P-channel transistor module 610 according to some embodiments. Referring to FIGS. 6A-6B and 7A-7B, the transistor modules 610 include a plurality of amplifier transistor circuits 612 and a frequency to voltage converter 628. Each amplifier transistor circuit 612 includes isolation circuitry, a transistor drive amplifier 636, and a transistor 616, where each transistor 616 couples in series with one or more transistors 616 of the other of the amplifier transistor circuits 612. Accordingly, the serially coupled transistors 616 cooperate to provide an amplified output Vout.

The isolation circuitry of the amplifier transistor circuits 612 receive the input control signal in parallel with the other amplifier transistor circuits 612, for example, after being converted from an optical signal by the frequency to voltage converter 628. In some embodiments, the isolation circuitry comprises an isolation signal amplifier 634, and a DC to DC power converter 626 that can provide power to the components of the corresponding amplifier transistor circuit 612. In addition to the isolation provided by the frequency to voltage converter 628, the isolation circuitry provides at least part of the isolation between the amplifier transistor circuits 612. For example, the isolation signal amplifier 634 provides some electrical isolation and an electrical safety barrier.

The transistor drive amplifier 636 receives the isolated control signals from the isolation amplifier 634 and drives the transistor 616 in accordance with the control signals. Some embodiments include additional feedback, for example, through voltage sensing circuits, to the transistor drive amplifier 636 to aid in controlling the voltage across the corresponding transistor 616 and response time.

A configuration of an amplifier system 200 was tested in generating a 1 kV output. In this configuration, the amplifier system 200 included an N-channel transistor module 214-N and a P-channel transistor module 214-P coupled in series and further coupled with the ground level control 212. Each transistor module 214 included four amplifier transistor circuits 312 similar to that of FIGS. 3A-3B and 4A-4B. threshold voltage adjustments (e.g., of 0 to ±5 V) for the transistor modules 214 were integrated into the voltage to frequency converter 234 allowing adjustments by using two potentiometers at the ground level control 212. Further, the voltage to frequency converter 234 and frequency to voltage converter 314 pairs can be configured such that the control voltage can go from 0 to ±10 V to both N- and P-channel transistor modules 214. A high-speed optocoupler 318 is cooperated with, and/or could be used as part of, the frequency to voltage converter 314 to isolate the reference output (e.g., gate drive signals) between transistors.

Table 1 below shows the reference voltages (Vref), the expected output voltages (Vout_target), the measured output voltages (Vout), and the percentage error between the expected and measured voltages. It shows that less than 1% of error is achieved when the amplifier operates at the output voltage of about 300 V or higher in this test.

| Vref (V) | Vout_target (kV) | Vout (kV) | % of error |
| --- | --- | --- | --- |
| 0 | 0 | 0.003 | 0.3 |
| 1 | 0.1 | 0.403 | 3 |
| 3 | 0.3 | 0.302 | 0.67 |
| 5 | 0.5 | 0.500 | 0 |
| 7 | 0.7 | 0.698 | 0.28 |
| 9 | 0.9 | 0.897 | 0.33 |
| 10 | 1 | 0.996 | 0.4 |

Figure 8:
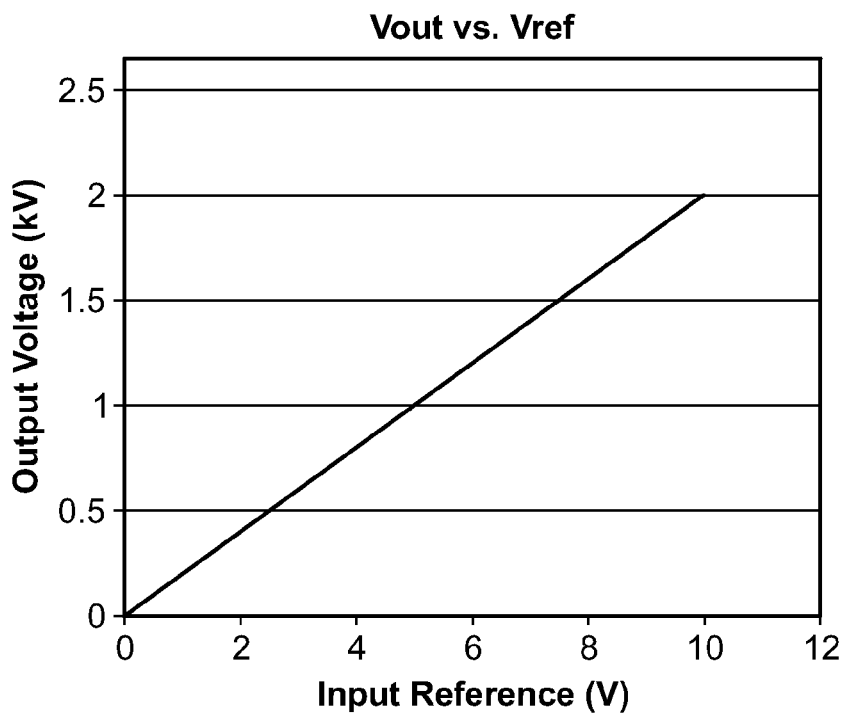
FIG. 8 shows a linear plot of measured output voltages Vout versus input reference voltages Vref according to some embodiments.

FIG. 8 shows a linear plot of measured output voltages Vout versus input reference voltages Vref provided by the test amplifier system in accordance with some embodiments. As shown, the output voltage tracked the reference voltage with minimal error.

Figure 9:
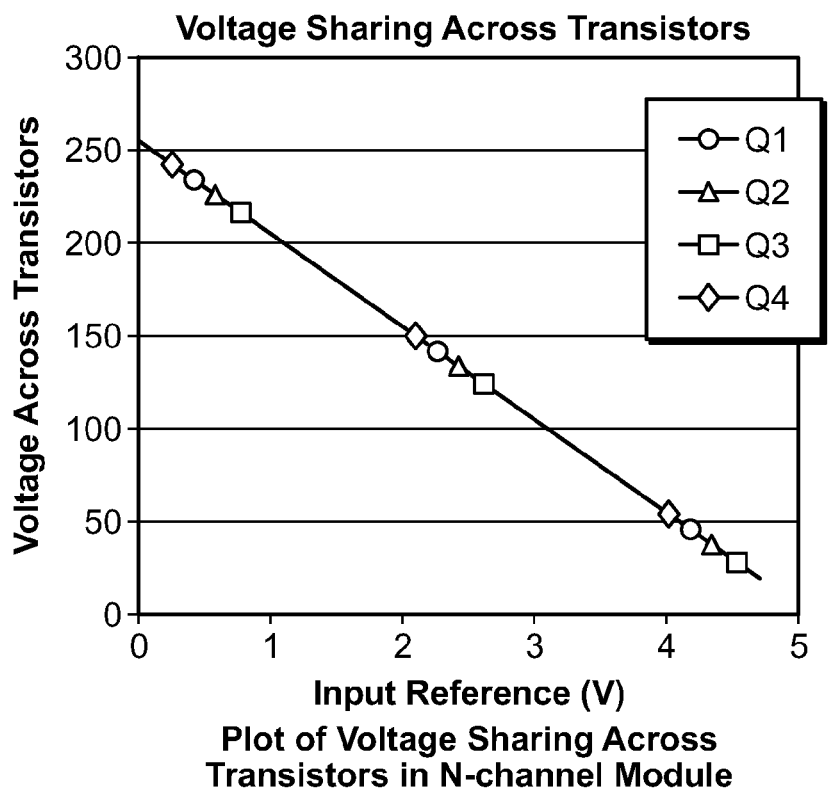
FIG. 9 shows a linear plot of voltage sharing across the four transistors of the exemplary N-channel module in a test configuration according to some embodiments.

FIG. 9 shows a linear plot of voltage sharing across the four transistors 316 of the exemplary N-channel transistor module 214-N in the test configuration of the amplifier system similar to the amplifier system 200 to FIGS. 2A-2B. Again, as described above, this test amplifier included one N-channel transistor module 214-N coupled in series with one P-channel transistor module 214-P. The four voltage traces (Q1, Q2, Q3 and Q4), which are substantially on top of each other, demonstrate that the voltage was substantially equally shared across the four serially coupled transistors 316 of the N-channel transistor module 214-N. The maximum voltage difference between them was measured at less than 1.5 V.

Figure 10:
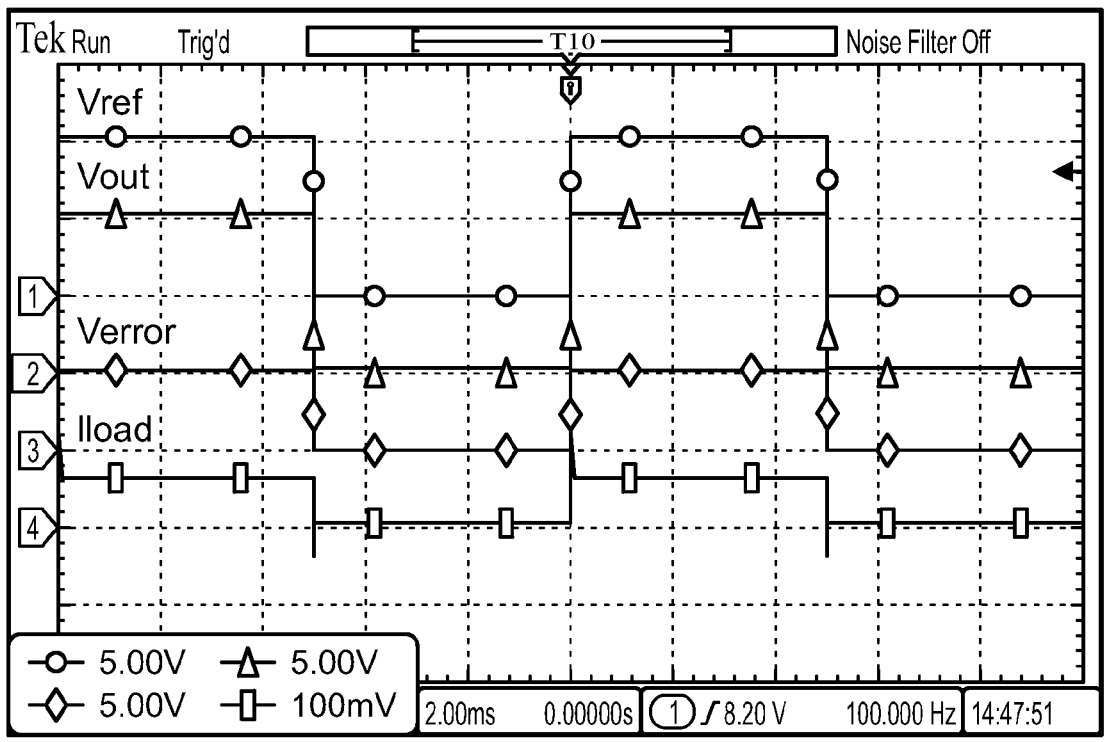
FIGS. 10, 12 and 14 show graphical measured waveforms of a reference voltage Vref applied to an example test amplifier system according to some embodiments, where the reference voltage Vref is a square wave modulated at 100 Hz, 1 kHz, and 5 kHz, respectively.
Figure 12:
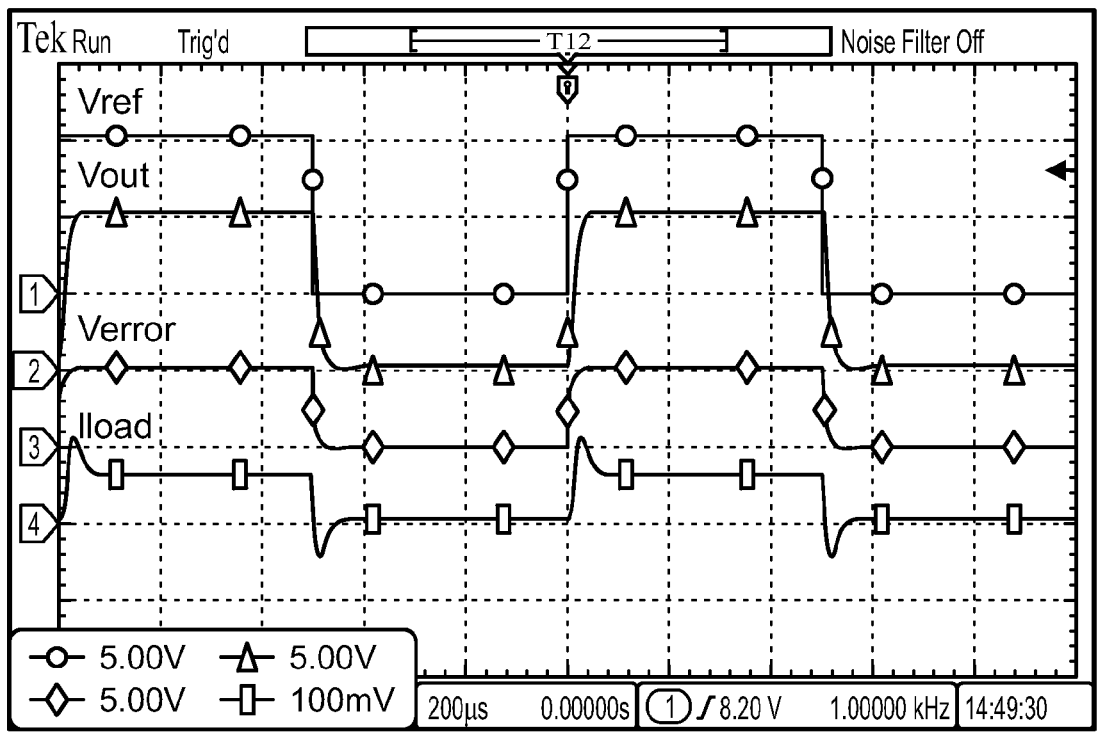
Figure 14:
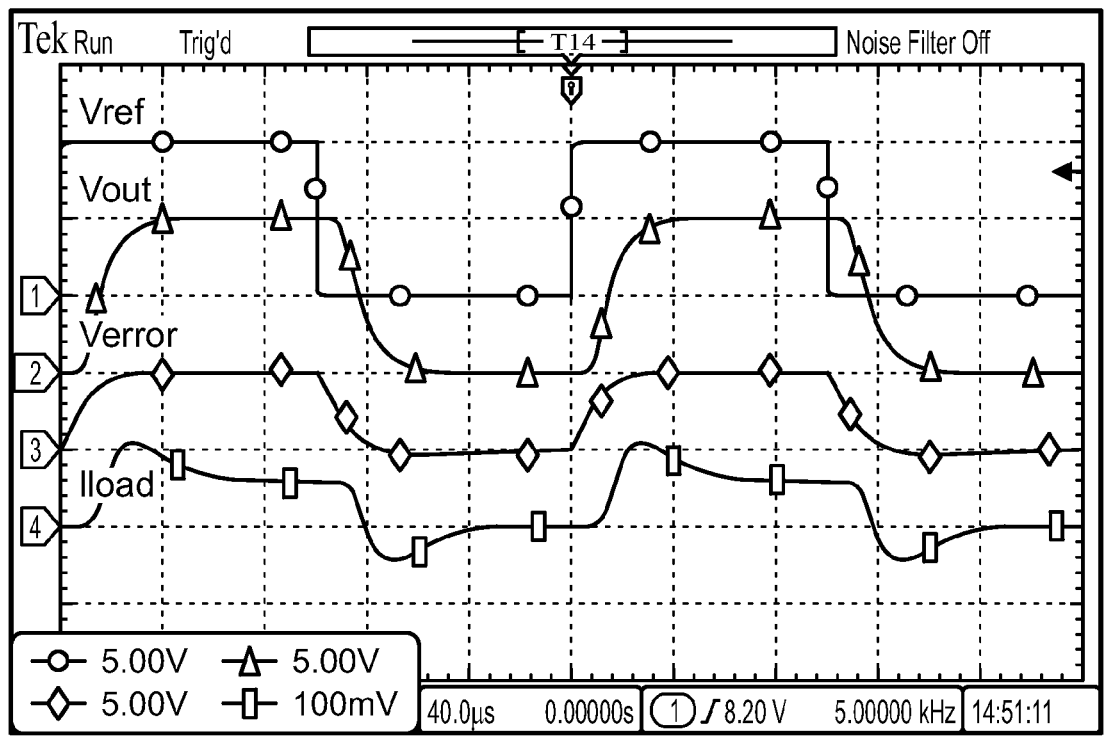

FIGS. 10, 12 and 14 show graphical measured wave forms of a reference voltage Vref applied to the above described example test amplifier system that has one N-channel transistor module and one P-channel transistor module, where the reference voltage Vref is a square wave modulated at 100 Hz, 1 kHz, and 5 kHz, respectively. Also depicted in FIGS. 10, 12 and 14 are the resulting amplified output voltage Vout, an error voltage Verror and a load current Iload. The reference voltage Vref is shown with a scale of 5 V/division; the amplified output voltage Vout is similarly shown with a scale of 5 V/division, and further scaled such that the 5 V depicted magnitude is equivalent to 1 kV at the output terminal; the error signal Verror is shown with a scale of 2 V/division; and the load current waveform Iload is shown with a scale of 1 V/division.

Figure 11:
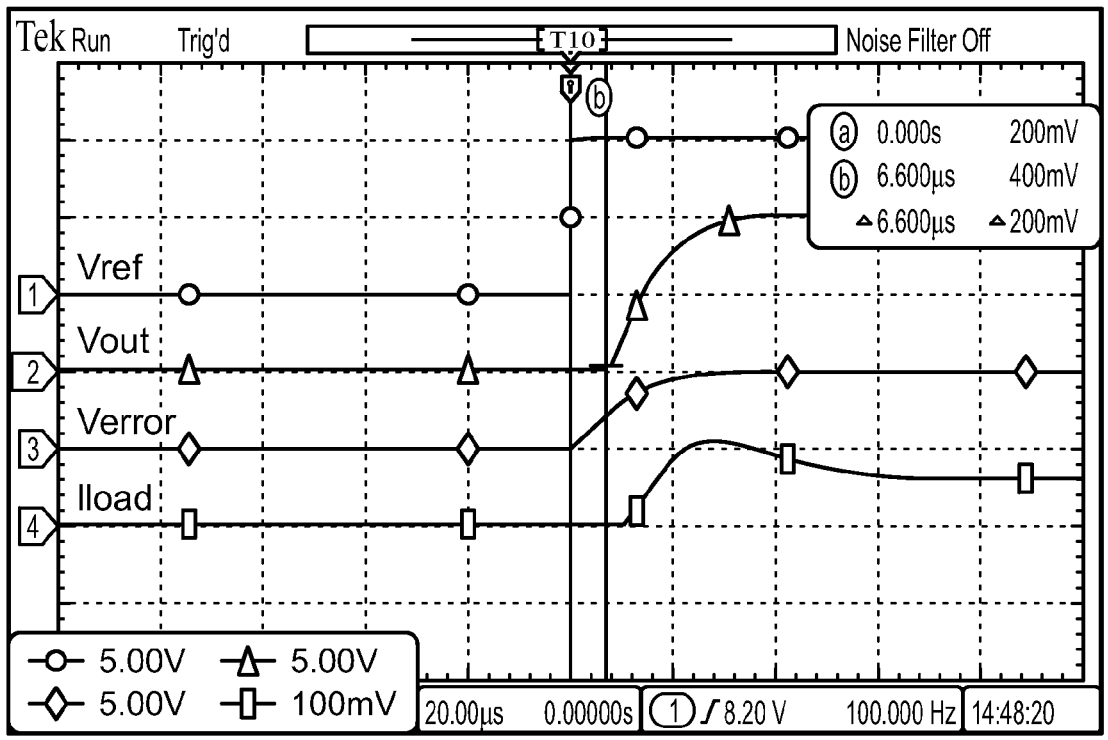
FIGS. 11, 13 and 15 show zoomed-in portions of the graphical measured wave forms of FIGS. 10, 12 and 14, respectively.
Figure 13:
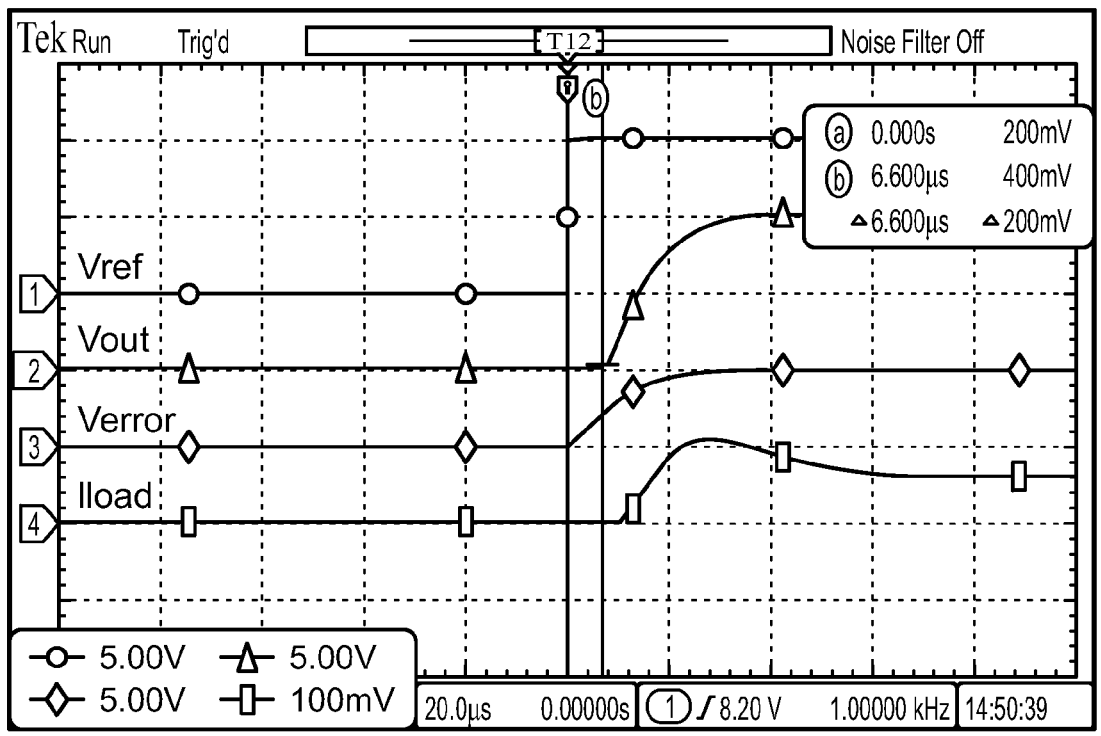
Figure 15:
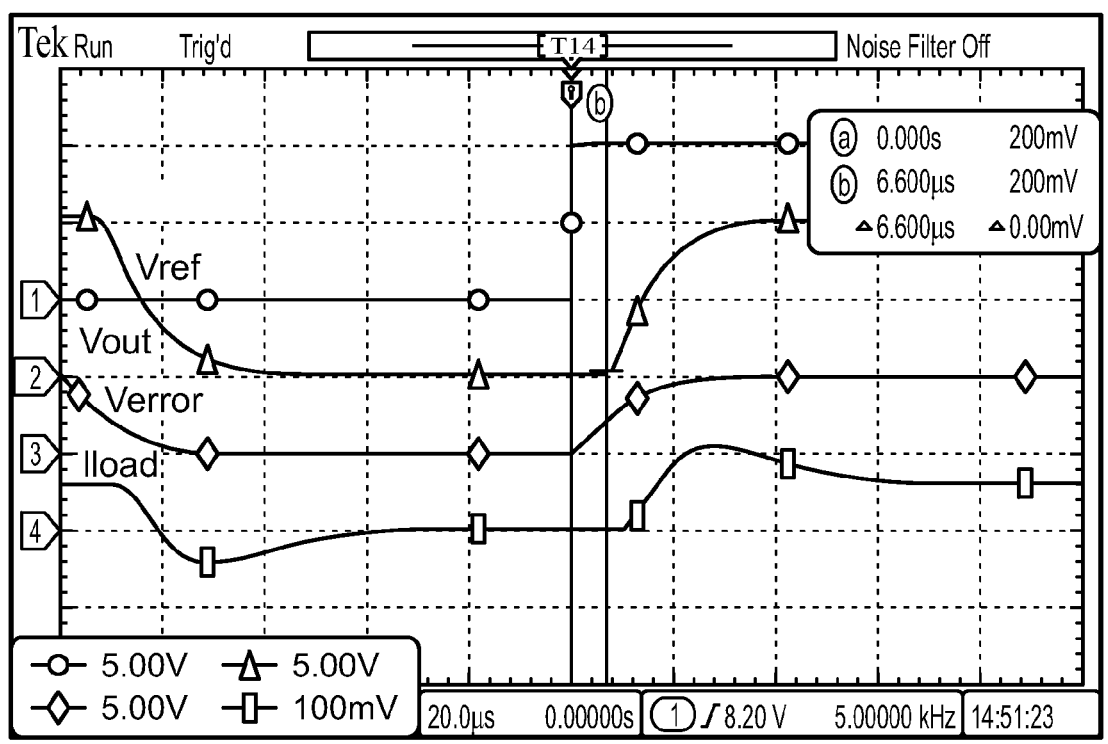

FIGS. 11, 13 and 15 show zoomed-in portions of the graphical measured wave forms of FIGS. 10, 12 and 14, respectively, about reference times T10, T12 and T14. The output voltage Vout and load current Iload waveforms are relatively symmetrical.

The present high voltage amplifiers and amplifier systems providing output voltages in excess of 1 kV, and in some instances 30 kV, or even 100 kV or more. For example, some embodiments can provide a linear amplifier that can operate as a gyrotron body power supply (GBPS) that controls the output connected to a reactive load (e.g., 1 nF and ~2 MΩ) while being capable of providing a voltage range from 0 to 35 kVdc at a nominal steady current of 20 mA and peak currents of about 100 mA for modulation. Modulation of the output also can be, for example, a square-wave with a frequency of 100 Hz, 1 kHz, 5 kHz or more. Accordingly, some embodiment provide closed-loop linear amplification utilizing series connected amplifier transistor circuits and/or transistor modules that can control the output of a gyrotron body power supply with the ability of achieving a smaller package. Further, some embodiments can provide high peak currents as well as the capability to source and sink currents in order to attain a desired speed of modulation.

Figure 16:
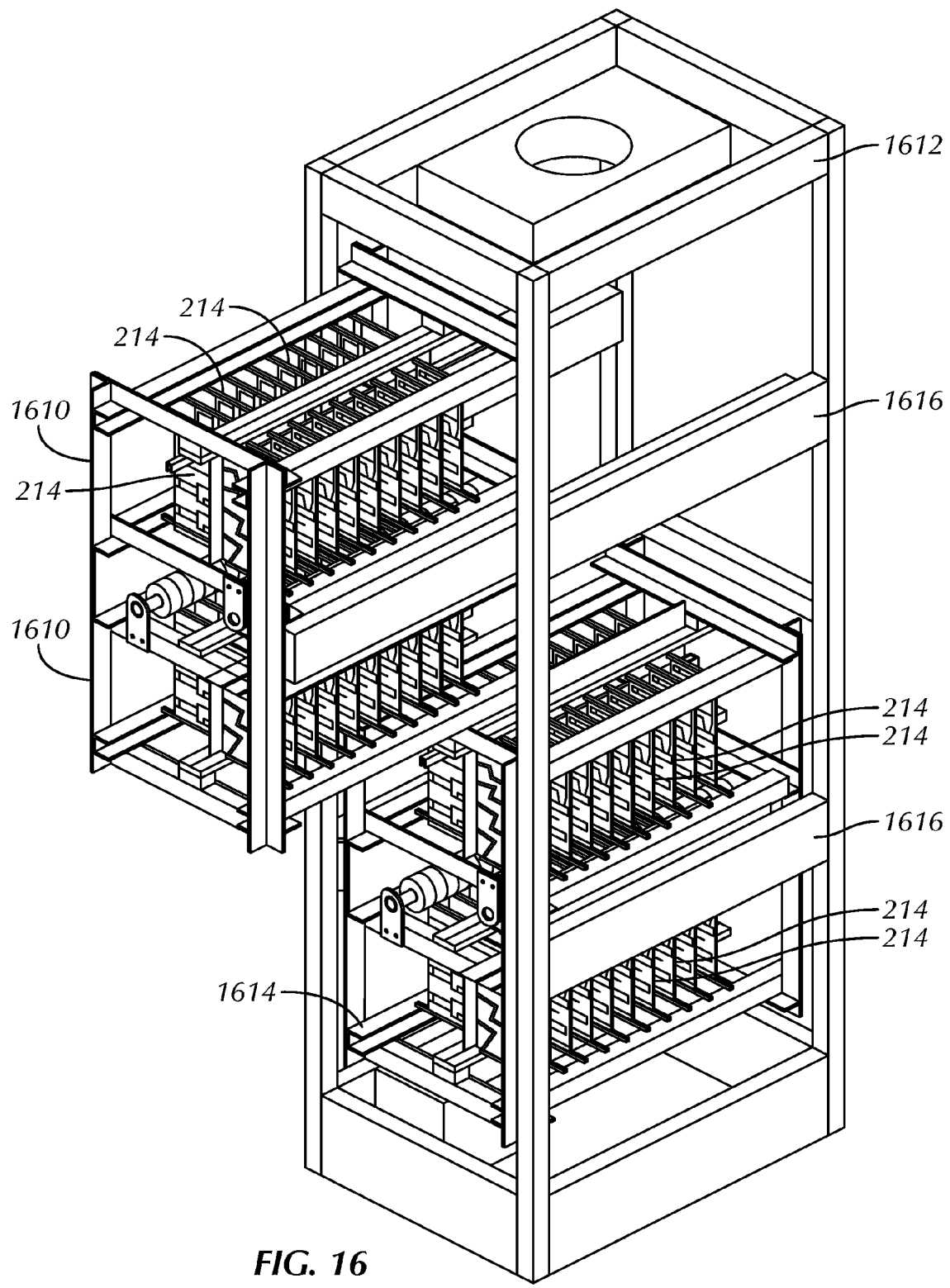
FIG. 16 illustrates a perspective view of an amplifier configured within a mounting structure or enclosure in accordance with some embodiments.

FIG. 16 illustrates a perspective view of an amplifier 1610 configured within a mounting structure or enclosure 1612 in accordance with some embodiments. The enclosure 1612 includes pull-out or rollout drawers or cages 1614 that can receive printed circuit boards (PCBs). FIG. 16 shows a pair of printed circuit board cages 1614 rolled out of the enclosure on drawer slides 1616. Each cage 1614 houses a plurality of transistor modules 214 that are coupled in series as described above. For example, twenty series-connected transistor modules 214 are housed in a PCB cage 1614 (e.g., an equivalent of two 19 inch PCB cages that are arranged back-to-back with a shared backplane between them). The backplane joins the transistor modules 214 in series from one side to the other and then from end to end. The transistor modules 214 slide into the PCB cage 1614 and can connect to the backplane, for example, by mating plugs and receptacles. Four of these PCB cages 1614 can be used in some implementations to contain a set of transistor modules 214 that can cooperate in forming a 45 kV amplifier 1610 or greater. The cages 1614 can be housed in the enclosure 1612 (e.g., standard 482.6 mm (19-in.) electronics rack).

The closed-loop linear amplifier 1610 utilizes transistors connected in series, as described above, to achieve the desired output voltage. The amplifier 1610 provides low continuous operating current (e.g., on the order of a few tens of milliamps) and with relatively low power dissipation. By cooperating complementary pairs of NPN and PNP transistors, the amplifier uses a set or string of NPN transistors in series and a set or string of PNP transistors in series with the output at the junction between of the NPN and PNP strings. The transistors 316 can be organized into the transistor modules 214, for example configured into transistor modules providing 1 kV, which allow the design to be easily adapted for applications at different voltage levels. Each transistor module 214 can be configured with, for example, four transistors 316 mounted on a printed circuit board (PCB) with corresponding isolation circuitry and the transistor voltage control and drive circuitry 324.

Power to the transistor modules 214 is provided by an isolation source and/or transformer 222 (not shown in FIG. 16). Ground level control 212 and/or power supply can be positioned within the enclosure 1612 or on a separate enclosure or rack (e.g., a separate enclosure that contains high voltage dc power supply and the ground level control). Fiber-optic links send the control signals (or transistor-drive signals) from the ground level control 212 to the series-connected transistor modules 214.

Other embodiments can be used to control a gyrotron cathode power supply (GCPS) at an output voltage and current as high as 80 kV and 50 A, respectively. For example, amplifier transistor circuits 312 each having sets of transistors 316 coupled in parallel, with the sets 514 of transistors 316 being coupled in series with one or more other sets 514 of transistors of one or more other amplifier transistor circuits. This configuration allows for the distribution of the voltage as well as power dissipation. Hundreds, a thousand or even thousands of amplifier transistor circuits can be cooperated in series to withstand the voltage of 100 kV or more at no load. With an arrangement of 1000 amplifier transistor circuits each having four transistors coupled in parallel, each transistor would have a voltage of about 100 V across it and a dissipation of about 125 W nominal and up to 375 W during modulation. Therefore, some embodiments can potentially connect 4000 transistor devices or more in a parallel/series fashion to control the output of a GCPS or other device. The numbers of transistors coupled in parallel and/or series would depend, in part, on the power dissipation that a package can tolerate. Accordingly, some embodiments may utilize transistor and liquid-cooling packages, other cooling techniques and/or transistors having greater power dissipation capabilities.

Figure 17:
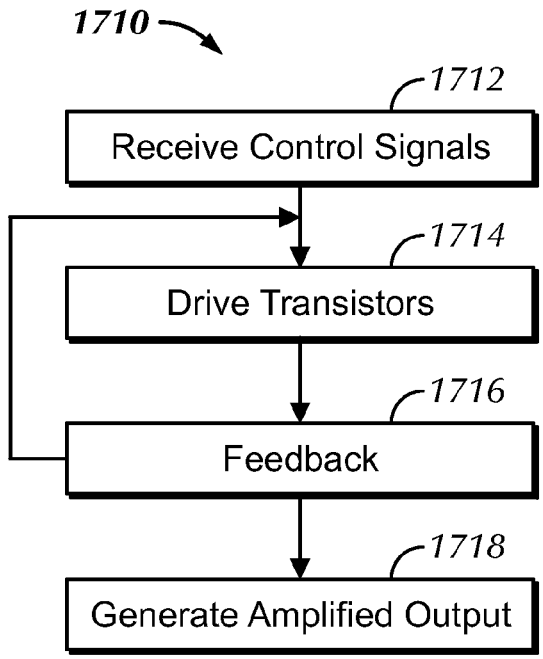
FIG. 17 depicts a simplified flow diagram of a process of generating an amplified output in accordance with some embodiments.

FIG. 17 depicts a simplified flow diagram of a process 1710 of generating an amplified output in accordance with some embodiments. In step 1712, control signals are received at a plurality of amplifier transistor circuits 312. As described above, in some embodiments each amplifier transistor circuit 312 is electrically isolated from the other amplifier transistor circuits. In many embodiments, the control signals are routed in parallel at each of the plurality of amplifier transistor circuits. For example, each transistor module 214 may couple with one or more optical fibers and include a fiber optic receiver that receives the optical control signals and forwards in parallel the converted signals to each of the amplifier transistor circuits. The optical fibers provide in part some electrical isolation of the amplifier transistor circuits 312 from the ground level control 212 that supplies the control signals.

Further, in some instances, the amplifier transistor circuits 312 include an optocoupler 318, an isolation signal amplifier 634 and/or other relevant circuitry that provides electrical isolation from other amplifier transistor circuits. Additionally, the amplifier transistor circuits 312 can each include a DC to DC power converter 326 to power one or more components of the amplifier transistor circuit providing further electrical isolation from the ground control and/or between amplifier transistor circuits.

In step 1714, the transistor 316 of each of the amplifier transistor circuits 312 is independently driven. Again, the transistors 316 are coupled in series, while the transistors are independently driven in parallel by corresponding transistor voltage control and drive circuits 324, drive amplifiers 636 and/or other relevant circuitry. Some embodiments include step 1716, where a feedback relative to voltage across each corresponding transistor is provided to the transistor voltage control and drive circuit 324. This allows the transistor voltage control and drive circuit 324 to make adjustments, in step 1714, in driving the corresponding transistor 316 in accordance with the feedback and the control signals. In some embodiments, the feedback circuitry and feedback 330 further provides timing control such that the plurality of transistors 316 have consistent activation and response timing, particularly with a modulated reference signal Vref. In step 1718, the serial-connected transistors 316 cooperatively generate an amplified output (e.g., Vout). Typically, the output is at a junction between the series of N-channel transistors and the series of P-channel transistors.

As described above, some embodiments further allow adjustments to the control signals at the ground level control 212 relative to thresholds of the transistors. These adjustments can be made at the ground level control, for example, through a first adjustment relative to N-channel transistors, and a second adjustment relative to P-channel transistors. Adjustments may alternatively or additionally be implemented at the amplifier transistor circuits relative to each transistor 316.

In some embodiments, the ground level control 212 includes and/or cooperates with one or more computers, microprocessors or other control circuitry to control the reference voltage Vref supplied to the ground level control.

Figure 18:
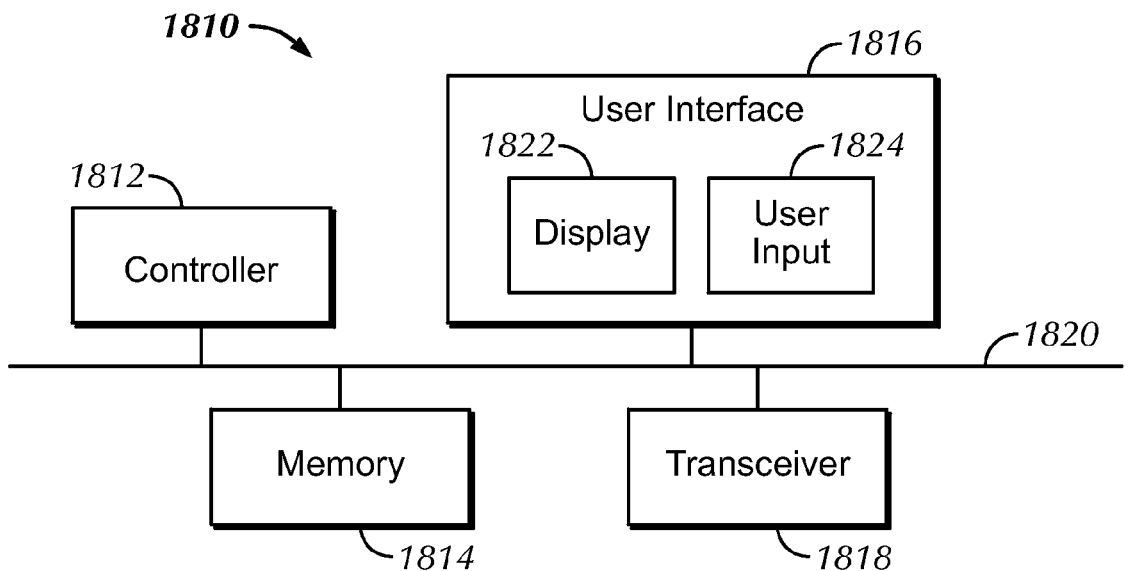
FIG. 18 illustrates a system for use in implementing methods, techniques, devices, apparatuses, systems, servers, sources and the like in providing amplified outputs in accordance with some embodiments.

FIG. 18 illustrates a system 1810 that can provide an amplified output and/or can utilize an amplifier system 200 in accordance with some embodiments. One or more components of the system 1810 may be used for implementing some of the ground level control, control over the ground level control and/or control relative to systems, circuitry and/or components mentioned above or below. However, the use of the system 1810 or any portion thereof is certainly not required.

By way of example, the system 1810 may comprise a controller or processor module 1812, memory 1814, a user interface 1816, one or more communication links, paths, buses or the like 1820. A power source or supply (not shown) is included or coupled with the system 1810, and in some instances may obtain power from the ground level power supply 238. The controller 1812 can be implemented through one or more processors, microprocessors, central processing unit, logic, local digital storage, firmware and/or other control hardware and/or software, and may be used to execute or assist in executing the steps of the methods and techniques described herein, and control various components, devices, circuitry, communications, programs, interfaces, etc. The user interface 1816 can allow a user to interact with the system 1810 and receive information through the system. In some instances, the user interface 1816 includes a display 1822 and/or one or more user inputs 1824, such as a keyboard, mouse, track ball, buttons, touch screen, touchpad, remote control, stylus, etc., which can be part of or wired or wirelessly coupled with the system 1810.

Typically, the system 1810 further includes one or more communication interfaces, ports, transceivers 1818 and the like allowing the system 1810 to communicate with the amplifier system 200, components of the amplifier, and/or other devices. Further, the communication can be over a bus, optical fiber, communication link 1820 and/or over one or more networks (e.g., distributed network, a local network, the Internet, other networks, etc.) or communication channels with other devices and/or other such communications. Further the transceiver 1818 can be configured for wired, wireless, optical, fiber optical cable or other such communication configurations or combinations of such communications.

The system 1810 comprises an example of a control and/or processor-based system with the controller 1812. Again, the controller 1812 can be implemented through one or more processors, controllers, central processing units, logic, software and the like. Further, in some implementations the controller 1812 may provide multiprocessor functionality.

The memory 1814, which can be accessed by the controller 1812, typically includes one or more processor readable and/or computer readable media accessed by at least the controller 1812, and can include volatile and/or nonvolatile media, such as RAM, ROM, EEPROM, flash memory and/or other memory technology. Further, the memory 1814 is shown as internal to the system 1810; however, the memory 1814 can be internal, external or a combination of internal and external memory. The external memory can be substantially any relevant memory such as, but not limited to, one or more of flash memory secure digital (SD) card, universal serial bus (USB) stick or drive, other memory cards, hard drive and other such memory or combinations of such memory. The memory 1814 can store code, software, firmware, executables, scripts, data, programming, programs, textual content, data, thresholds, parameters, identifiers, log or history data, user information and the like.

One or more of the embodiments, methods, processes, approaches, and/or techniques described above or below may be implemented in one or more computer programs executable by a processor-based system. By way of example, such a processor based system may comprise the processor based system 1810, a computer, etc. Such a computer program may be used for executing various steps and/or features of the above or below described methods, processes and/or techniques. That is, the computer program may be adapted to cause or configure a processor-based system to execute and achieve the functions described above or below. For example, such computer programs may be used for implementing any embodiment of the above or below described steps, processes or techniques for providing an amplified output. As another example, such computer programs may be used for implementing any type of tool or similar utility that uses any one or more of the above or below described embodiments, methods, processes, approaches, and/or techniques. In some embodiments, program code modules, loops, subroutines, etc., within the computer program may be used for executing various steps and/or features of the above or below described methods, processes and/or techniques. In some embodiments, the computer program may be stored or embodied on a computer readable storage or recording medium or media, such as any of the computer readable storage or recording medium or media described herein.

Accordingly, some embodiments provide a processor or computer program product comprising a medium configured to embody a computer program for input to a processor or computer and a computer program embodied in the medium configured to cause the processor or computer to perform or execute the steps comprising any one or more of the steps involved in any one or more of the embodiments, methods, processes, approaches, and/or techniques described herein. For example, some embodiments provide one or more computer-readable storage mediums storing one or more computer programs for use with a processor, computer or the like, where the one or more computer programs are configured to cause a computer and/or processor based system to execute steps comprising: receiving control signals at a plurality of amplifier transistor circuits; electrically isolating the plurality of amplifier transistor circuits; independently driving, in each of the amplifier transistor circuits, a corresponding transistor that coupled in series with at least one transistor of one or more other amplifier transistor circuits; and generating an amplified output from the series connected transistors.

Some embodiments provide high voltage amplifiers that can generate greater amplification with reduced power dissipation. Further, the high voltage amplifier can modulate the voltage at frequencies up to 5 KHz or more depending on the response time, signal delays (e.g., conversion between voltage to frequency and frequency to voltage), and the load. Still further, the modular configuration allows an amplifier to be configured to provide substantially any relevant output voltage. The high voltage amplifiers can be used in numerous other applications. For example, the amplifier can be used in charging capacitance, use with vacuum tubes, charge and discharge cable charges, and other such applications.

While the invention herein disclosed has been described by means of specific embodiments, examples and applications thereof, numerous modifications and variations could be made thereto by those skilled in the art without departing from the scope of the invention set forth in the claims.

What is claimed is:

1. An amplifier apparatus, comprising:
a plurality of amplifier transistor circuits coupled in series, wherein each of the plurality of amplifier transistor circuits comprises:
a transistor, wherein the transistors of the plurality of amplifier transistor circuits are coupled in series;
a transistor voltage control and drive circuit coupled with the corresponding transistor, wherein the transistor voltage control and drive circuit is configured to control and drive the corresponding transistor in accordance with received control signals and in parallel with the other of the plurality of amplifier transistor circuits; and
isolation circuitry that isolates control of the transistor from control of the other of the amplifier transistor circuits;
wherein the plurality of amplifier transistor circuits are configured to be controlled and driven in parallel relative to the control signals;
wherein each of the plurality of amplifier transistor circuits further comprises one or more additional transistors coupled in parallel with the corresponding transistor of the corresponding amplifier transistor circuit such that the one or more additional transistors are configured to provide additional current and distribution power dissipation.

2. The apparatus of claim 1, wherein each of the transistor voltage control and drive circuits comprise feedback circuitry configured to receive feedback relative to a voltage across a corresponding one of the transistors, wherein each of the transistor voltage control and drive circuits is configured to receive the control signals and the corresponding feedback, and to drive the corresponding transistor according to the control signal and the corresponding feedback such that the voltages across each of the transistors are substantially the same.

3. The apparatus of claim 2, wherein the isolation circuitry of each of the amplifier transistor circuits further comprises a frequency to voltage converter coupled with the transistor voltage control and drive circuit, wherein the frequency to voltage converter is configured to receive the control signals and convert the control signals to voltage control signals.

4. The apparatus of claim 3, wherein the isolation circuitry of each of the amplifier transistor circuits further comprises an optocoupler coupled with the frequency to voltage converter, wherein the optocoupler is configured to receive the control signals and forward the control signals to the frequency to voltage converter while providing at least some of electrical isolation of the amplifier transistor circuit from the other the amplifier transistor circuits.

5. The apparatus of claim 4, wherein each of the plurality of amplifier transistor circuits further comprises:
a power converter configured to receive electrical power and convert the power and supply the converted power to the amplifier transistor circuit while further electrically isolating each of the plurality of amplifier transistor circuits from the other of the plurality of amplifier transistor circuits.

6. The apparatus of claim 1, wherein the isolation circuitry of each of the amplifier transistor circuits further comprises an isolation signal amplifier configured to receive the control signals and provide at least some electrical isolation of the amplifier transistor circuit from the other of the amplifier transistor circuits.

7. The apparatus of claim 6, wherein each of the plurality of amplifier transistor circuits further comprises a transistor drive amplifier coupled with the respective isolation signal amplifier and configured to receive the isolated control signals from the isolation amplifier and drives the transistor in accordance with the control signals.

8. The apparatus of claim 1, further comprising:
a plurality of transistor modules each comprising two or more of the plurality of amplifier transistor circuits, wherein the plurality of transistor modules are coupled in series and wherein each of the plurality of transistor modules are controlled and driven in parallel relative to the received control signals.

9. The apparatus of claim 8, wherein the plurality of transistor modules comprise a plurality of N-channel transistor modules and a plurality of P-channel transistor modules, wherein each of the transistors of the N-channel transistor modules are N-channel transistors and each of the transistors of the P-channel transistor modules are P-channel transistors.

10. The apparatus of claim 1, further comprising:
ground level control communicationally coupled with each of the plurality of amplifier transistor circuits, wherein the ground level control is configured to communicate the control signals in parallel to the plurality of amplifier transistor circuits.

11. The apparatus of claim 10, wherein the ground level control further comprises a voltage to frequency converter configured to convert the control signals to optical control signals and communicate the optical control signals in parallel to the plurality of amplifier transistor circuits such that the optical signals provide at least some isolation of the ground level control from the plurality of amplifier transistor circuits.

12. The apparatus of claim 11, wherein the ground level control further comprises:
a first transistor threshold voltage adjustment circuit; and a second transistor threshold voltage adjustment circuit;

wherein the first transistor threshold voltage adjustment circuit is configured to cause an adjustment of the control signals corresponding to threshold voltages of the transistors of a first set of the plurality of amplifier transistor circuits, and the second transistor threshold voltage adjustment circuit is configured to cause an adjustment of the control signals corresponding to threshold voltages of the transistors of a second set of the plurality of amplifier transistor circuits.

13. The apparatus of claim 12, wherein the transistors of the first set of the plurality of amplifier transistor circuits comprise N-channel transistors and the transistors of the second set of the plurality of amplifier transistor circuits comprise P-channel transistors, wherein the first transistor threshold voltage adjustment circuit is configured to cause the adjustment of the control signals corresponding to the threshold voltages of the N-channel transistors of the first set of the plurality of amplifier transistor circuits and the second transistor threshold voltage adjustment circuit is configured to cause the adjustment of the control signals corresponding to the threshold voltages of the P-channel transistors of the second set of the plurality of amplifier transistor circuits.

14. An amplifier apparatus, comprising:
a plurality of amplifier transistor circuits coupled in series and cooperatively configured to generate an amplified output;
each of the amplifier transistor circuits comprising:
an input configured to receive control signals;
a transistor, wherein the transistor is coupled in series with at least one other transistor of another one of the amplifier transistor circuits such that the amplifier transistor circuits are coupled in series; and
a transistor voltage control and drive circuit coupled with the corresponding transistor and configured to receive the control signals and drive the corresponding transistor according to the control signals;
wherein each of the plurality of amplifier transistor circuits is isolatedly controlled and isolatedly driven relative to the other of the plurality of amplifier transistor circuits such that the driving each of the amplifier transistor circuits is not dependent upon another one of the plurality of amplifier transistor circuits;
wherein each of the amplifier transistor circuits further comprises feedback coupled between the transistor and the transistor voltage control and drive circuit such that the transistor voltage control and drive circuit is configured to drive the transistor according to the input control signals and receive feedback such that a voltage across each of the transistors of each of the plurality of amplifier transistor circuits is substantially the same; and
a plurality of transistor modules coupled in series and cooperatively configured to generate the amplified output, wherein each of the plurality of transistor modules is isolatedly controlled and isolatedly driven such that each transistor module is not dependent upon another one of the plurality of transistor modules such that the transistor modules are controlled and driven in parallel, and each transistor module of the plurality of transistor modules comprises two or more of the plurality of amplifier transistor circuits.

15. The apparatus of claim 14, further comprising:
ground level control communicationally coupled with each of the plurality of transistor modules, wherein the ground level control is configured to communicate the control signals in parallel to the plurality of transistor modules.

16. The apparatus of claim 15, wherein the ground level control further comprises a voltage to frequency converter configured to convert the control signals to optical control signals and communicate the optical control signals in parallel to the plurality of amplifier transistor circuits such that the optical signals provide at least some isolation of the ground level control from the plurality of amplifier transistor circuits.

17. The apparatus of claim 16, wherein each of the plurality of amplifier transistor circuits further comprises:
a power converter configured to receive electrical power and convert the power and supply the converted power to the amplifier transistor circuit while further electrically isolating each of the plurality of amplifier transistor circuits from the other of the plurality of amplifier transistor circuits.

18. The apparatus of claim 14, wherein each of the plurality of the amplifier transistor circuits further comprises:
isolation circuitry configured to receive the control signals from an isolated ground level control, wherein the isolation circuitry of each of the plurality of amplifier transistor circuits comprises a frequency to voltage converter configured to convert the received control signals from a frequency to a voltage and to provide the converted control signals to the transistor voltage control and drive circuit.

19. The apparatus of claim 18, wherein each of the isolation circuitry further comprises an optocoupler configured to receive the control signal and forward the control signal to the corresponding frequency to voltage converter providing at least some of the isolation of the amplifier transistor circuit.

20. The apparatus of claim 1, wherein the isolation circuitry of each of the amplifier transistor circuits further comprises:
an isolation signal amplifier; and
a transistor drive amplifier coupled with the isolation signal amplifier and configured to receive isolated control signals from the isolation amplifier and drive the transistor in accordance with the control signals.

* * * * *

UNITED STATES PATENT AND TRADEMARK OFFICE
CERTIFICATE OF CORRECTION

PATENT NO. : 8,854,144 B2  
APPLICATION NO. : 13/619896  
DATED : October 7, 2014  
INVENTOR(S) : Huynh et al.

Page 1 of 1

It is certified that error appears in the above-identified patent and that said Letters Patent is hereby corrected as shown below:

In the CLAIMS:
Claim 4, column 16, line 18, before "the amplifier" insert --of--.

Signed and Sealed this
Twenty-first Day of April, 2015

Michelle K. Lee
*Director of the United States Patent and Trademark Office*